(12) United States Patent
Yamazaki et al.

(10) Patent No.: US 8,531,185 B2
(45) Date of Patent: Sep. 10, 2013

(54) MAGNETIC SHIELD BODY AND MAGNETIC SHIELDED ROOM

(75) Inventors: Keita Yamazaki, Inzai (JP); Shigetaka Hirosato, Inzai (JP)

(73) Assignee: Takenaka Corporation, Osaka (JP)

(*) Notice: Subject to any disclaimer, the term of this patent is extended or adjusted under 35 U.S.C. 154(b) by 455 days.

(21) Appl. No.: 12/743,537

(22) PCT Filed: Nov. 11, 2008

(86) PCT No.: PCT/JP2008/003265
§ 371 (c)(1),
(2), (4) Date: Aug. 10, 2010

(87) PCT Pub. No.: WO2009/066422
PCT Pub. Date: May 28, 2009

(65) Prior Publication Data
US 2010/0301864 A1  Dec. 2, 2010

(30) Foreign Application Priority Data
Nov. 19, 2007 (JP) ................... 2007-299548

(51) Int. Cl.
*G01R 33/44* (2006.01)
(52) U.S. Cl.
USPC .......................... 324/318; 335/301
(58) Field of Classification Search
USPC .............. 324/318; 372/96; 335/301
See application file for complete search history.

(56) References Cited

U.S. PATENT DOCUMENTS

| | | | | |
|---|---|---|---|---|
| 4,978,812 A | * | 12/1990 | Akeyoshi et al. | 174/389 |
| 6,566,991 B1 | * | 5/2003 | Rimkunas et al. | 335/301 |
| 7,508,209 B2 | * | 3/2009 | Dietz et al. | 324/318 |
| 2006/0262826 A1 | * | 11/2006 | Dietz et al. | 372/96 |

FOREIGN PATENT DOCUMENTS

| | | |
|---|---|---|
| EP | 1605742 A1 | 12/2005 |
| JP | 01-161897 A | 6/1989 |
| JP | 3-099487 A | 10/1991 |
| JP | 06-013781 A | 1/1994 |
| JP | 08-162794 A | 6/1996 |
| JP | 2000-353896 A | 12/2000 |
| JP | 2002164686 A | 6/2002 |
| JP | 2004-014908 A | 1/2004 |
| JP | 2006269662 A | 10/2006 |
| JP | 2007299923 A | 11/2007 |
| JP | 2008-160027 A | 7/2008 |

OTHER PUBLICATIONS

Office Action issued in Japanese Patent Application No. 2007-299548 dated Apr. 26, 2012.
European Search Report corresponding to European Patent Application No. 08851164.7, dated Jul. 3, 2013.
Hemming L.H., "Applying the Waveguide Below Cut-Off Principle to Shielded Enclosure Design", Aug. 17, 1992, pp. 287-289, XP010249826.

* cited by examiner

*Primary Examiner* — Melissa Koval
*Assistant Examiner* — Rishi Patel
(74) *Attorney, Agent, or Firm* — Sughrue Mion, PLLC

(57) ABSTRACT

A magnetic shield body comprises a cylindrical body unit configured by having a plurality of cylindrical bodies having permeability and mutually same longitudinal cross-sectional shapes arranged with a mutual interval such that central axes of the cylindrical bodies coincide with each other and side surfaces of the cylindrical bodies form a mutually same plane; and a supporting unit that supports a plurality of the cylindrical body units such that side surfaces of cylindrical bodies of the cylindrical body units face each other with a mutual interval.

5 Claims, 28 Drawing Sheets

Axial-direction interval   Axial direction (a)

(b)

(a)

(b)

(a)

(b)

(a)

(b)

(a)

(b)

(c)

(d)

(a)

(b)

(c)

(d)

(e)

(f)

MAGNETIC SHIELD BODY AND MAGNETIC SHIELDED ROOM

CROSS REFERENCE TO RELATED APPLICATIONS

This application is a National Stage of International Application No. PCT/JP2008/003265 filed Nov. 11, 2008, claiming priority based on Japanese Patent Application No. 2007-299548 filed Nov. 19, 2007, the contents of all of which are incorporated herein by reference in their entirety.

TECHNICAL FIELD

The present invention relates to a magnetic shield body and a magnetic shield room that shield a magnetic field.

BACKGROUND ART

Conventionally, in order to shield a magnetic field, there has been proposed a magnetic shield room which prevents leakage of a magnetic field generated in a magnetic field generation source to outside, by covering the magnetic field generation source. This magnetic shield room is put in practical use as a room (hereinafter, "MRI room") in which an MRI (Magnetic Resonance Imaging) device used in medical facilities is installed, for example. Broadly, this magnetic shield room is configured by having a magnetic material embedded in all or a part of a wall, a ceiling, and a floor. Leakage of a magnetic field to outside is prevented by having a magnetic flux reaching the wall, the ceiling, and the floor bypassed via the magnetic material.

Because this magnetic shield room surrounds the magnetic field generation source with the wall, the ceiling, and the floor, an internal space of the magnetic shield room is closed hermetically, and this gives a feeling of pressure to a person entering the room. In order to resolve this problem, configuring a magnetic shield room using an open magnetic shield body is proposed (see, for example, Patent Document 1). This open magnetic shield body is configured by having plural cylindrical bodies supported with a frame. According to this configuration, the inside and outside of the magnetic shield room are visually open via the internal space of the cylindrical bodies. Therefore, a feeling of pressure to a person entering the room can be decreased.

However, because the magnetic shield body in Patent Document 1 has plural cylindrical bodies linearly contacted to each other, there is a problem that stress concentration is generated in these contact portions. In order to solve this problem, inventors of the present invention proposed a magnetic shield body configured by having plural cylindrical bodies arranged in a non-contact shape with a mutual interval between the cylindrical bodies (Patent Document 2, not published at the time of filing the present application). According to this configuration, a stress load to the cylindrical bodies can be decreased, and assembly and disassembly of the magnetic shield body are facilitated.

Patent Document 1: Japanese Patent Application Laid-open No. H6-13781
Patent Document 2: Japanese Patent No. 2006-350064

DISCLOSURE OF INVENTION

Problem to be Solved by the Invention

However, the magnetic shield body described in Patent Document 2 has a possibility that the shielding effect of the magnetic field is reduced, depending on an arrangement position of the cylindrical bodies. FIG. 38 is a plan view of a conventional MRI room 100. A magnetic shield body 102 is arranged on a wall 101 of this MRI room 100, and this magnetic shield body 102 is configured by having plural cylindrical body units 103 arranged with a mutual interval. Arrows in the drawing show principal directions of lines of magnetic force of magnetic fields generated from an MRI device 104.

A magnetic resistance of each of the cylindrical body units 103 in an axial direction and magnetic resistances of the plural cylindrical body units 103 in adjacent directions (directions orthogonal to the axial direction of each cylindrical body) are compared. Because the cylindrical body units 103 are continuously formed by a magnetic material in an axial direction, a magnetic resistance in the axial direction is small. Because an air layer is present between the cylindrical body units 103, a magnetic resistance in an adjacent direction is large. Consequently, a proportion that a magnetic flux is induced to a longitudinal axial direction (hereinafter, "axial direction") of the cylindrical body units 103 not in an adjacent direction is large, in a region A1 in which a magnetic flux of a magnetic field is orthogonal to a wall surface direction of the wall 101. As a result, a magnetic flux is discharged from an external end of each of the cylindrical body units 103 to outside of the MRI room 100, and the shielding effect of a magnetic field reduces.

An object of the present invention is to further improve the shielding effect of a magnetic field, in an open magnetic shield body configured by using cylindrical bodies and in a magnetic shield room.

Means for Solving Problems

To solve the above problems, one aspect of the present invention comprises a cylindrical body unit configured by having a plurality of cylindrical bodies having permeability and mutually same longitudinal cross-sectional shapes arranged with a mutual interval such that central axes of the cylindrical bodies coincide with each other and side surfaces of the cylindrical bodies form a mutually same plane; and a supporting unit that supports a plurality of the cylindrical body units such that side surfaces of cylindrical bodies of the cylindrical body units face each other with a mutual interval.

Figure 1:
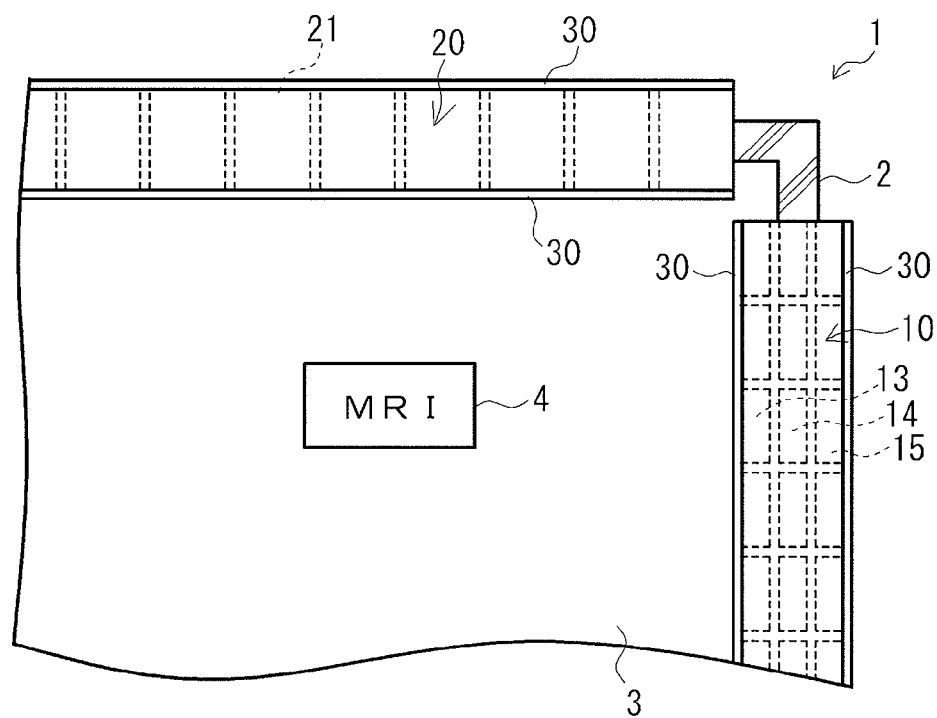
FIG. 1 A plan view of relevant parts of a magnetic shield room according to an embodiment of the present invention.

EXPLANATIONS OF REFERENCE NUMERALS 1 magnetic shield room
2, 101 wall
3 floor
4, 104 MRI device
5 silicon steel sheet
6 MRI model
6a coil
10 first magnetic shield body
11, 21, 41, 103 cylindrical body unit
12, 22 frame
12a frame material
12b space
13 to 15 cylindrical body
16 interlayer
20 second magnetic shield body
30 electromagnetic shield glass
100 MRI room
102 magnetic shield body
A1 orthogonal region
A2 parallel region
A3 non-orthogonal parallel region

BEST MODE(S) FOR CARRYING OUT THE INVENTION

Embodiments of the present invention will be explained below in detail with reference to the accompanying drawings. First, [I] the basic concept of the embodiments is explained, [II] specific contents of the embodiments are then explained, and finally [III] modifications of the embodiments are explained. Note that the present invention is not limited to the embodiments.

[I] Basic Concept of Embodiments

The basic concept common to respective embodiments is described first. A magnetic shield body according to the present embodiment prevents the whole or a part of magnetic fields generated in a magnetic field generation source from being leaked to outside via the magnetic shield body, by arranging the magnetic shield body around the magnetic field generation source. The magnetic field generation source is arbitrary, and includes an MRI device, a permanent magnet, and an electromagnetic coil. The magnetic shield room is configured by having the magnetic shield body arranged on a wall, a ceiling, or a floor of the magnetic shield room. The magnetic shield room includes a configuration having a magnetic shield body arranged on only a part of the wall, and the like, in addition to a configuration having a magnetic shield body arranged on the entire surface of the wall and the like.

In this configuration, a basic characteristic of the present embodiment is that a cylindrical body unit constituting a magnetic shield body is configured such that plural cylindrical bodies having permeability are arranged with a mutual interval between the cylindrical bodies. That is, the cylindrical body in Patent Document 2 mentioned above divided into plural parts corresponds to the cylindrical body unit of the present embodiment. As explained above, by configuring one cylindrical body unit using plural cylindrical bodies having a mutual interval between the cylindrical bodies, a magnetic resistance of the cylindrical body unit in an axial direction is increased, and leakage of a magnetic field to this axial direction is reduced or prevented, by providing a layer having small permeability such as that of an air layer between the cylindrical bodies.

[II] Specific Contents of Embodiments

Specific contents of the magnetic shield body and the magnetic shield room according to the present embodiment are explained next.

(Configuration)

FIG. 1 is a plan view of relevant parts of the magnetic shield room according to the present embodiment. This magnetic shield room 1 is an MRI room, is provided with a wall 2, a floor 3, and a ceiling (not shown in FIG. 1), and has an MRI device 4 as a magnetic field generation source arranged on an upper surface of the floor 3. The wall 2 of the magnetic shield room 1 is configured to surround the entire surrounding of the MRI device 4. A first magnetic shield body 10 and a second magnetic shield body 20 are arranged on at least a part of the wall 2. An electromagnetic shield glass 30 is provided at the inside and outside of the first magnetic shield body 10 and the second magnetic shield body 20. The first magnetic shield body 10 corresponds to a magnetic shield body in the claims, and the second magnetic shield body 20 corresponds to a second magnetic shield body in the claims. The first magnetic shield body 10 and the second magnetic shield body 20 arranged on the wall 2 are explained below. A configuration similar to that explained below can be also applied to the floor 3 and the ceiling.

(Configuration—First Magnetic Shield Body)

The first magnetic shield body 10 is explained first. As shown in the perspective view of the relevant parts in FIG. 2, the first magnetic shield body 10 is configured to include plural cylindrical body units 11 and a frame 12.

(Configuration—First Magnetic Shield Body—Cylindrical Body Unit)

Figure 3:
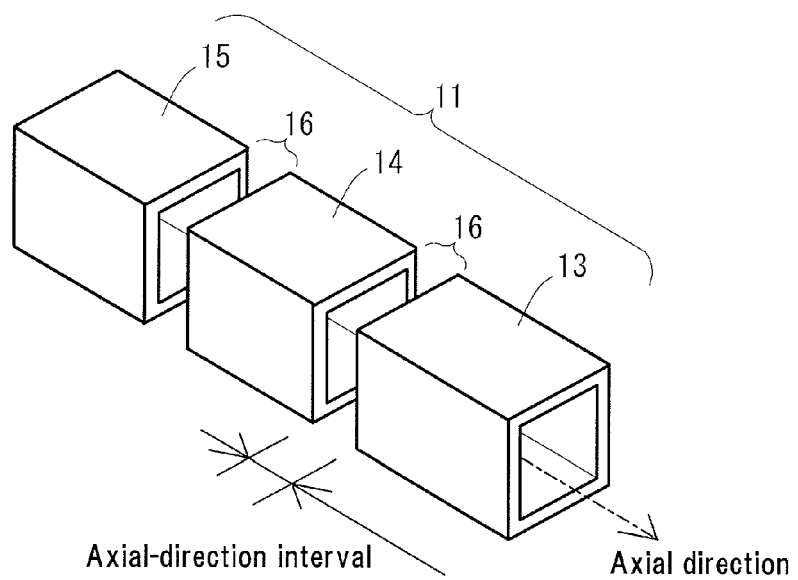
FIG. 3 A perspective view of cylindrical body units.

Each of the cylindrical body units 11 is configured to include plural (three, in this case) cylindrical bodies 13 to 15, as shown in the perspective view in FIG. 3. Each end of each of the cylindrical bodies 13 to 15 in an axial direction is an opening. These openings of the ends are communicated with each other in an internal space. Longitudinal cross-sectional shapes of the cylindrical bodies 13 to 15 (cross-sectional shapes of cross sections orthogonal to axial directions of the cylindrical bodies 13 to 15; this is also applied to subsequent explanations) are the same with each other. In this case, the cross-sectional shapes are squares in the same size. The cylindrical bodies 13 to 15 are configured as square cylindrical bodies as a whole. The cross-sectional shapes of the cylindrical bodies 13 to 15 are arbitrary so long as the cylindrical bodies are mutually identical. For example, the cross-sectional shapes can be triangles, hexagons, or trapezoids. Alternatively, the cylindrical bodies 13 to 15 can be circular cylindrical bodies by having cross-sectional shapes as round or elliptical shapes. However, when magnetic resistances of adjacent cylindrical bodies are to be decreased by setting side surfaces of the adjacent cylindrical bodies as flat as described in Patent Document 2, preferably, side surfaces of the cylindrical bodies 13 to 15 in the present embodiment are also flat.

The cylindrical bodies 13 to 15 are configured with a magnetic material, and have permeability capable of causing a magnetic flux to bypass inside the cylindrical bodies 13 to 15. A detailed kind of this magnetic material is arbitrary, and can be a silicon steel sheet, permalloy, an electromagnetic steel sheet, or an amorphous sheet. More specifically, the cylindrical bodies 13 to 15 can be manufactured by bending and welding one silicon steel sheet having a large width, or by welding or butting against four silicon steel sheets to each other. In this case, the cylindrical bodies 13 to 15 can be manufactured individually. Alternatively, the cylindrical bodies 13 to 15 can be manufactured by manufacturing a long cylindrical body having a length corresponding to the cylindrical body unit 11, and thereafter by cutting the long cylindrical body in a predetermined length. The cylindrical bodies 13 to 15 can be coated with an anticorrosive.

The cylindrical bodies 13 to 15 configured in this way are arranged such that central axes of the cylindrical bodies 13 to 15 (passage axes of centers of the longitudinal cross-sectional shapes) of the cylindrical bodies 13 to 15 coincide with each other, and such that side surfaces of the cylindrical bodies form mutually the same planes. That is, the cylindrical bodies 13 to 15 are arranged adjacently such that ends of other cylindrical bodies 14 and 15 are located at a position to which an end of one cylindrical body 13 is extended along the axial direction of this cylindrical body 13.

The cylindrical bodies 13 to 15 have a mutual interval between the cylindrical bodies (hereinafter, "axial-direction interval"). An interlayer 16 is formed between the cylindrical bodies 13 to 15. Preferably, this interlayer 16 is filled with a material having a high magnetic resistance. For example, the interlayer 16 can be formed as a simple air layer, or a magnetic shielding layer formed with a specific nonmagnetic material can be arranged as the interlayer 16 between the cylindrical bodies 13 to 15. In arranging this magnetic shielding layer, this is specifically configured such that a short cylindrical body made of a nonmagnetic material, having the same longitudinal cross-sectional shapes as those of the cylindrical bodies 13 to 15, is formed. These cylindrical bodies 13 to 15 are arranged with a mutual interval between the cylindrical bodies. By arranging the cylindrical bodies 13 to 15 with a mutual interval in this way, a magnetic resistance between the cylindrical bodies 13 to 15 (hereinafter, "axial-direction magnetic resistance") can be increased. Alternatively, a spacer can be arranged between the cylindrical bodies 13 to 15 to hold the mutual interval between the cylindrical bodies 13 to 15 at a predetermined interval.

Figure 4:
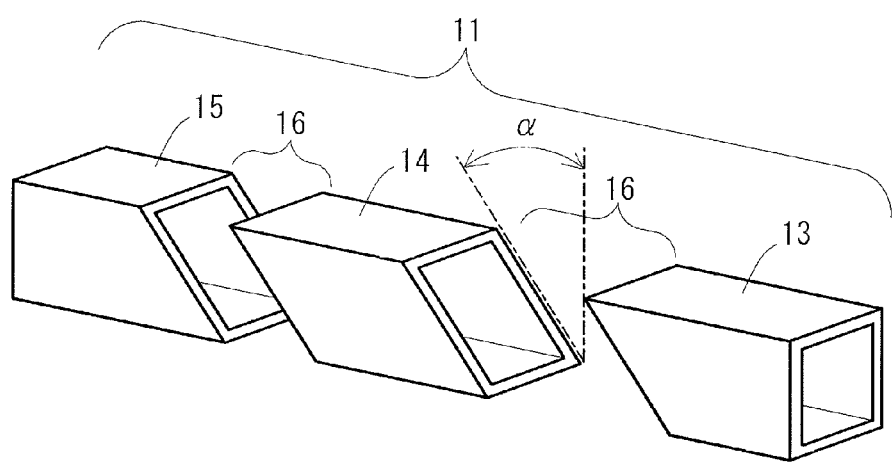
FIG. 4 A perspective view of a modification of the cylindrical body units.

The formation angle, shape, or length of the interlayer 16 is arbitrary. In an example of FIG. 3, the cylindrical bodies 13 to 15 are divided at a cross section along a direction orthogonal to the axial direction (corresponding to a longitudinal cross section in the claims), thereby forming the interlayer 16. Alternatively, as shown in FIG. 4, the interlayer 16 can be formed by dividing the cylindrical bodies 13 to 15 at a cross section having a predetermined angle α to the orthogonal direction. In addition to the dividing at a plane section, the cylindrical bodies can be also divided at a non-plane section (for example, a curved surface, and an uneven surface).

The number of the cylindrical bodies 13 to 15 (the number of divisions of the cylindrical body unit 11) is arbitrary. Although the cylindrical bodies 13 to 15 are arranged by three by dividing the cylindrical body unit 11 into three in the example of FIG. 3, the cylindrical body unit 11 can be divided into two, or divided into four or more. However, as shown in embodiments described later, an axial-direction magnetic resistance can be increased, and the magnetic-field shielding effect in the axial direction can be increased, by dividing the cylindrical body unit into three or more instead of dividing into two. The cylindrical body unit 11 having a different number of divisions can be mixed and present in one first magnetic shield body 10.

(Configuration—First Magnetic Shield Body—Frame)

Figure 2:
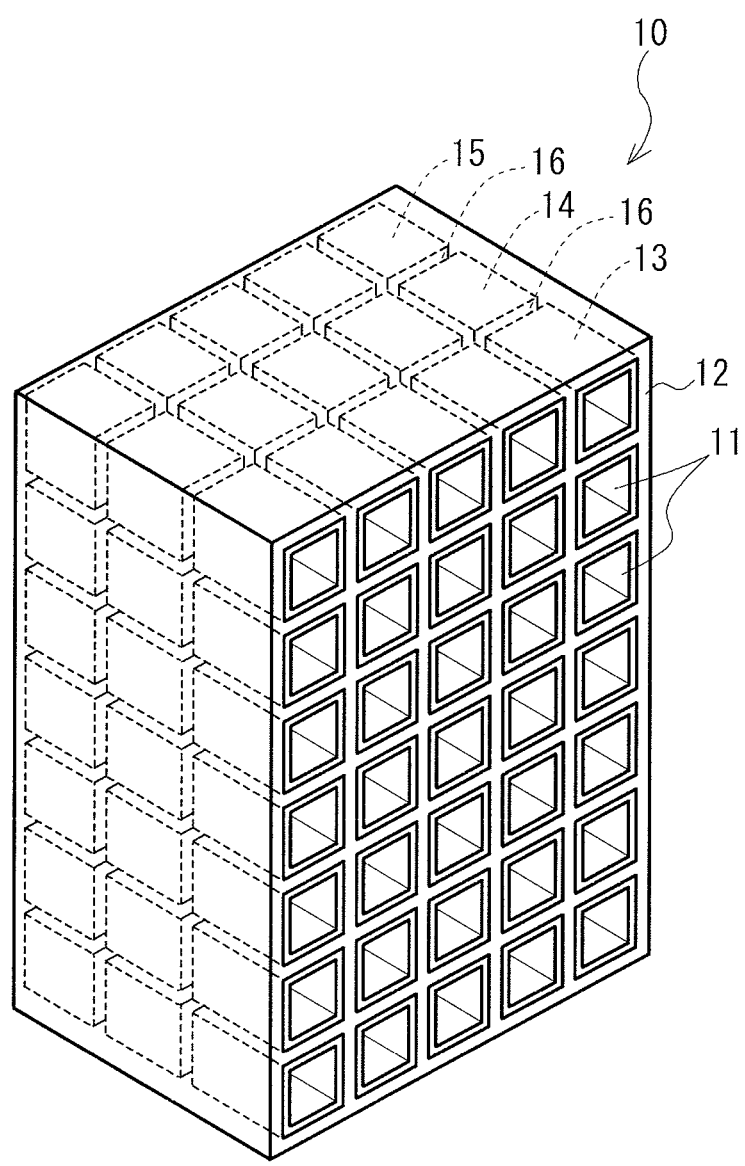
FIG. 2 A perspective view of relevant parts of a first magnetic shield body.

In FIG. 2, the frame 12 supports the cylindrical body unit 11, and corresponds to a supporting unit in the claims. As shown in the perspective view in FIG. 5, this frame 12 is configured by having plural flat frame materials 12a arranged in a horizontal direction and in a vertical direction, and by combining the flat frame materials 12a in a curb shape. A cylindrical space 12b approximately corresponding to an external shape of the cylindrical body unit 11 is formed between the frame materials 12a. By inserting the cylindrical body units 11 into the spaces 12b, the cylindrical body units 11 are arranged in a non-contact state with a mutual interval between the cylindrical body units 11 (hereinafter, "adjacent-direction interval"), by having axial directions of the cylindrical body units 11 in a parallel direction and by having side surfaces of the cylindrical bodies 13 to 15 of the cylindrical body units 11 in mutually parallel directions. A magnetic resistance formed between the cylindrical body units 11 by arranging the adjacent-direction interval in this way is called "adjacent-direction magnetic resistance".

A material of the frame materials 12a is arbitrary so long as the material has a magnetic resistance sufficiently larger than those of the cylindrical bodies 13 to 15, and also so long as the material has desired intensity to support the cylindrical body unit 11. For example, a wood or a resin can be used for the material. Particularly, the electromagnetic wave shielding effect can be obtained by using a conductive material for the material of the frame material 12a.

Figure 5:
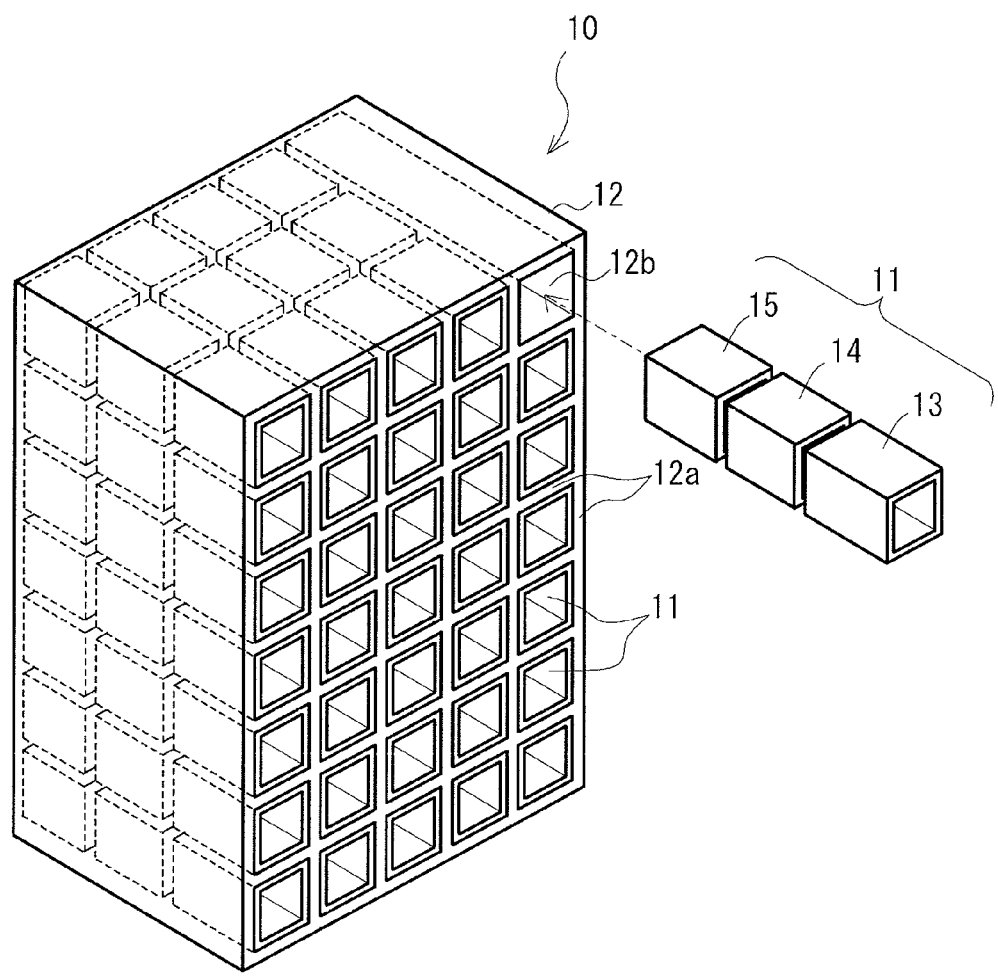
FIG. 5 An exploded perspective view of the first magnetic shield body.
Figure 6:
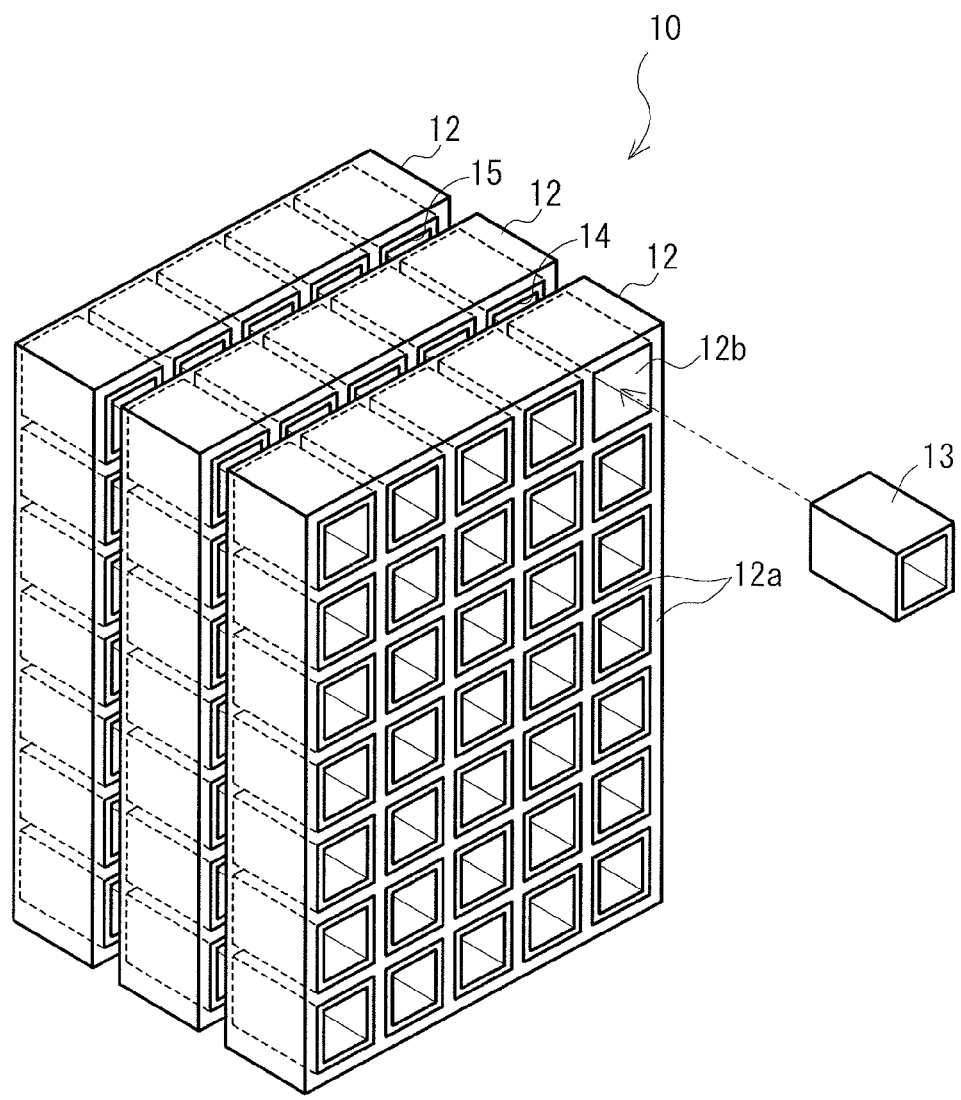
FIG. 6 An exploded perspective view of a first magnetic shield body manufactured by a method different from the method of FIG. 5.

As a manufacturing method of the first magnetic shield body 10, a manufacturing method shown in FIG. 6 can be also used in addition to a manufacturing method shown in FIG. 5. That is, in the method shown in FIG. 5, the frame 12 is formed as one frame having a depth corresponding to the entire depth of the first magnetic shield body 10, and the cylindrical bodies 13 to 15 are collectively inserted into this frame 12. On the other hand, in the method shown in FIG. 6, the frame 12 is formed as plural divided frames each having a depth corresponding to a depth of the cylindrical bodies 13 to 15, and the cylindrical bodies 13 to 15 are individually inserted into the frames 12. In the method shown in FIG. 6, the first magnetic shield body 10 can be also structured by arranging the frames 12 with a mutual interval between the frames 12 in a state having the cylindrical bodies 13 to 15 inserted into the frames 12, and thus effects identical to those of the first magnetic shield body 10 manufactured by the method shown in FIG. 5 can be obtained.

(Configuration—Details of Structure Relevant to Magnetic Resistance)

In the present embodiment, details of a configuration of each part relevant to a magnetic resistance are determined to have a relationship of "adjacent-direction magnetic resistance<axial-direction magnetic resistance". For a configuration of each part relevant to this magnetic resistance, for example, an axial-direction interval, an adjacent-direction interval, a substance forming the interlayer 16 present between the cylindrical bodies 13 to 15, or the thickness and material of the frame material 12a can be mentioned. For example, regarding the axial-direction magnetic resistance, this magnetic resistance can be set large when the axial-direction interval is enlarged and also when a magnetic resistance of a substance forming the interlayer 16 is enlarged. Regarding the adjacent-direction magnetic resistance, this magnetic resistance can be set small when the adjacent-direction interval is small and also when a magnetic resistance of a substance forming a frame material 16a is small. Particularly, when influence of a substance of the interlayer 16 and a material of the frame material 12a can be disregarded, a relationship of "adjacent-direction magnetic resistance<axial-direction magnetic resistance" can be obtained by setting an axial-direction interval shown in the perspective view of the relevant parts (shown by omitting the frame 12) in FIG. 7 larger than an adjacent-direction interval. By setting the axial-direction magnetic resistance larger than the adjacent-direction magnetic resistance in this way, bypassing the lines of magnetic force having principal directions along the axial directions to adjacent directions can be promoted as described later.

Figure 7:
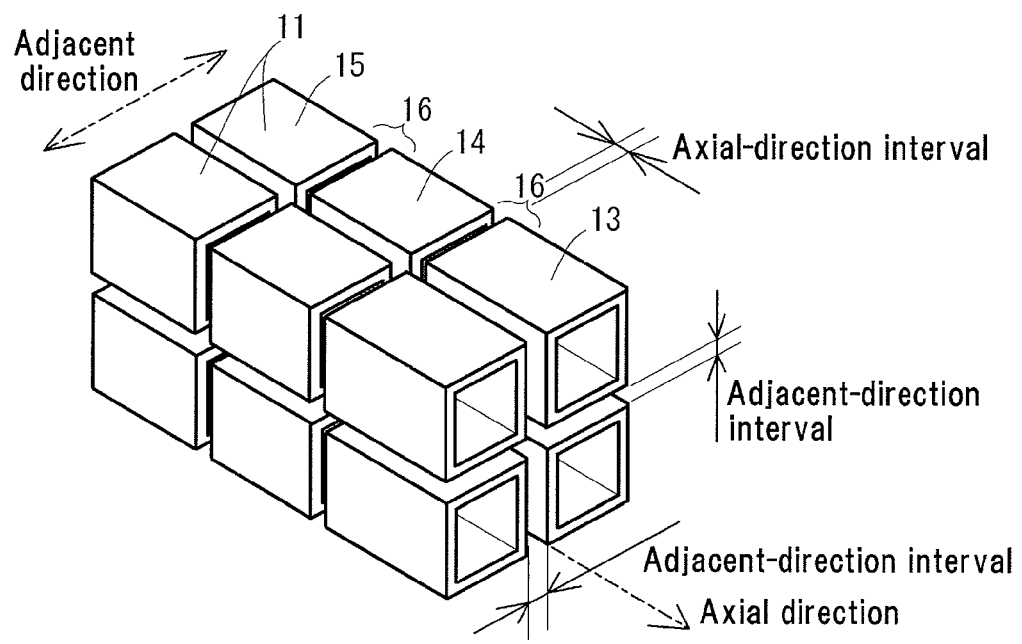
FIG. 7 An explanatory diagram of an axial-direction interval and an adjacent-direction interval, and a perspective view of relevant parts of a plurality of cylindrical body units shown in FIG. 2.

As shown in FIG. 7, preferably, the cylindrical bodies 13 to 15 in the cylindrical body unit 11 and the cylindrical bodies 13 to 15 in other cylindrical body unit 11 arranged adjacently to the cylindrical body unit 11 are located adjacently to each other. This arrangement structure can be provided by configuring each of the cylindrical body units 11 in the same shape and the same dimension, and by arranging the cylindrical body units 11 with a predetermined interval such that an end face of each of the cylindrical body units 11 is located on the same plane. According to this arrangement structure, parts having a minimum magnetic resistance of the cylindrical body units 11 (that is, sidewall parts of the cylindrical bodies 13 to 15) are adjacent to each other. Therefore, magnetic flux propagation between mutually adjacent cylindrical body units 11 can be promoted, and induction of a magnetic flux along the axial direction of the cylindrical body unit 11 can be reduced. Consequently, discharging of a magnetic flux from an end surface of each of the cylindrical body units 11 in the axial direction to outside can be decreased or prevented.

(Configuration—Second Magnetic Shield Body)

Figure 8:
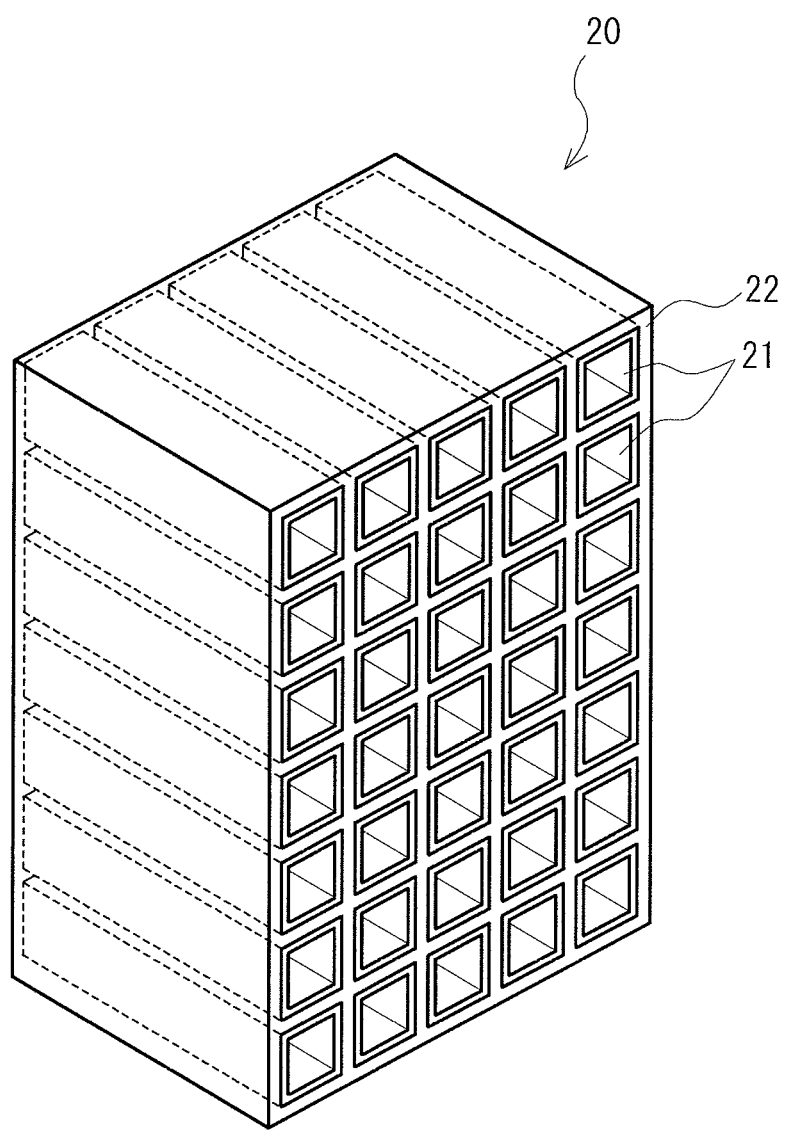
FIG. 8 A perspective view of a second magnetic shield body.

The second magnetic shield body 20 is explained next. As shown in the perspective view of the relevant parts in FIG. 8, the second magnetic shield body 20 is configured by supporting cylindrical body units 21 with a frame 22. The second magnetic shield body 20 can be configured in a similar manner to that of the magnetic shield body according to the invention of Patent Document 2. The cylindrical body units 21 are configured in a similar external shape to that of the cylindrical body units 11 of the first magnetic shield body 10 by using a magnetic material. Each of the cylindrical body units 21 is configured by one continuous cylindrical body, without isolating the cylindrical bodies 13 to 15 constituting the cylindrical body unit 11 from each other. The frame 22 is configured similarly to the frame 12 of the first magnetic shield body 10. By supporting the cylindrical body units 21 with this frame 22, the cylindrical body units 21 are arranged in a non-contact state, by having axial directions of the cylindrical body units 21 in a parallel direction, and by having side surfaces of the cylindrical body units 21 in mutually parallel directions. The first magnetic shield body 10 and the second magnetic shield body 20 can be isolated from each other, or can be connected to each other via a part of the wall 2 or via a hollow unit made of a permeable or conductive material.

(Configuration—Electromagnetic Shield Glass)

In FIG. 1, the electromagnetic shield glass 30 is an electromagnetic wave shielding unit to reduce or shield electromagnetic waves, and is provided on the entire surface at an interior side and on the entire surface at an exterior side of the first magnetic shield body 10 and the second magnetic shield body 20. This electromagnetic shield glass 30 is configured by sandwiching a meshed metal sheet with a single sheet glass, for example. By providing the electromagnetic shield glass 30 in this way, leakage of electromagnetic waves as well as magnetism to outside can be reduced or prevented. However, the electromagnetic shield glass 30 can be provided at only one of the inside and outside of the first magnetic shield body 10 and the second magnetic shield body 20, or can be provided at only outside of the first magnetic shield body 10 and the second magnetic shield body 20 when the frame 12 can shield a certain level of electromagnetic waves, for example. When the electromagnetic wave shielding effect is unnecessary, the electromagnetic shield glass 30 can be omitted.

Example 1

Figure 9:
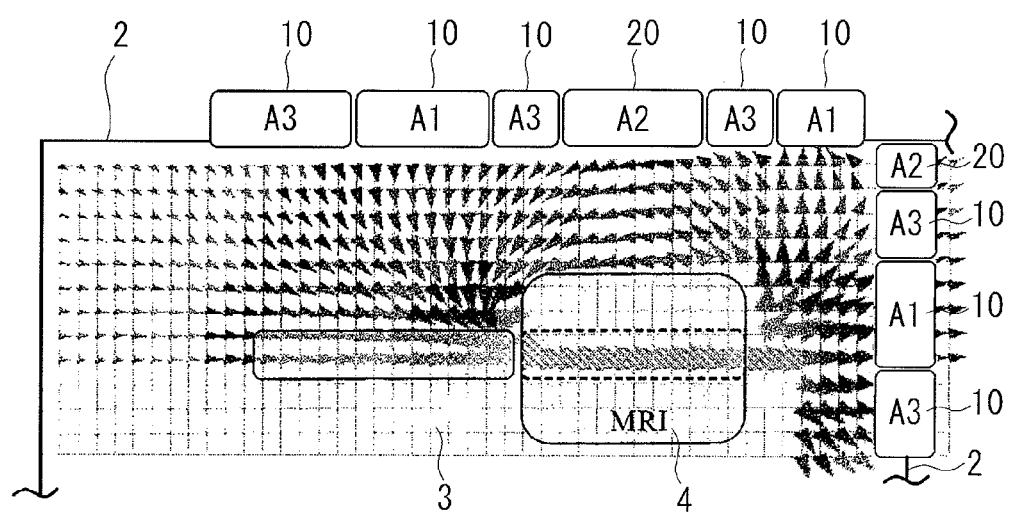
FIG. 9 A plan view of a magnetic shield room according to an Example 1.

An operational effect of the magnetic shield room 1 configured as described above is explained next by exemplifying Examples. FIG. 9 is a plan view of the magnetic shield room 1, and shows principal directions of lines of magnetic force in magnetic fields generated from the MRI device 4. These magnetic fields are directed to outside with the MRI device 4 as a center, and finally reach the wall 2. At this time, an angle formed between principal directions of lines of magnetic force and a direction of a wall surface of the wall 2 is different depending on a position and a direction of the MRI device 4 relative to the wall 2. Depending on this angle, the wall 2 is broadly classified into a region (hereinafter, "orthogonal region") A1 in which principal directions of the lines of magnetic force are orthogonal to the wall 2, a region (hereinafter, "parallel region") A2 in which principal directions of the lines of magnetic force are in parallel to the wall 2, and a region (hereinafter, "non-orthogonal parallel region") A3 in which principal directions of the lines of magnetic force form an angle not in orthogonal to or not in parallel to the wall 2. The first magnetic shield body 1 is arranged on the wall 2 of the orthogonal region A1 and the non-orthogonal parallel region A3, and the second magnetic shield body 20 is arranged on the wall 2 of the parallel region A2.

In the parallel region A2, a magnetic resistance of the cylindrical body unit 21 is smaller than a magnetic resistance of air, like in Patent Document 2. Therefore, a magnetic flux of a magnetic field reaching the cylindrical body unit 21 is absorbed by the cylindrical body unit 21, and this absorbed magnetic flux is propagated to other cylindrical body adjacent to the cylindrical body unit 21. By repeating the propagation to this adjacent direction, thereby inducing a magnetic flux within the second magnetic shield body 20, leakage of a magnetic field to outside can be prevented.

Figure 10:
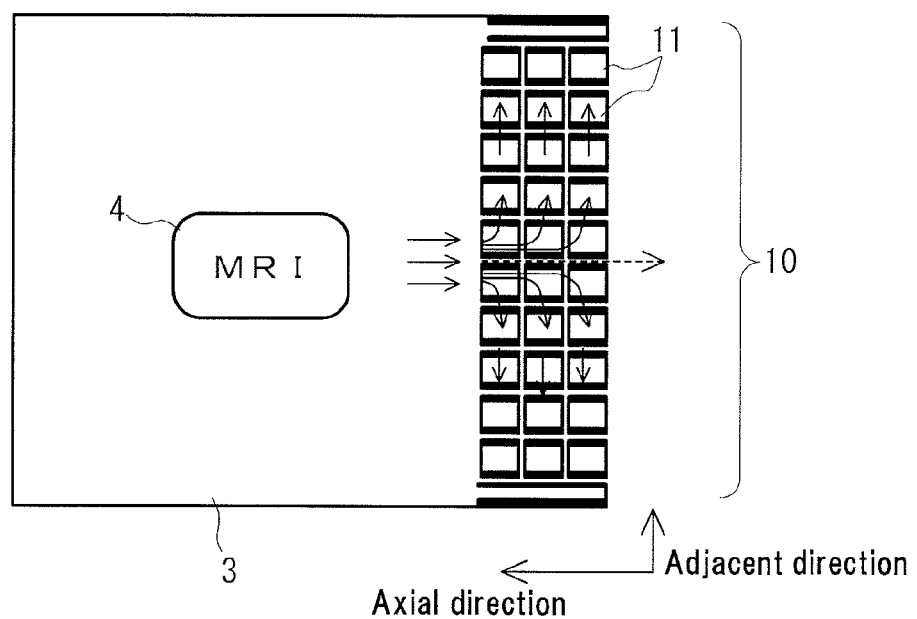
FIG. 10 A diagram showing a direction of a magnetic flux in a magnetic shield body in an orthogonal region.

On the other hand, in the orthogonal region A1 and the non-orthogonal parallel region A3, regarding the magnetic flux absorbed by the cylindrical body unit 11, by repeating the propagation between the cylindrical body units 11, thereby inducing a magnetic flux within the first magnetic shield body 10, leakage of a magnetic field to outside can be prevented, in a similar manner to that in the parallel region A2. FIG. 10 shows a direction of a magnetic flux in the first magnetic shield body 10 in the orthogonal region A1. A magnetic flux is sequentially propagated within the cylindrical bodies 13 to 15 along an axial direction. Because a magnetic resistance in this axial direction is large, propagation to an adjacent direction is promoted, and propagation along the axial direction is suppressed. Therefore, leakage of a magnetic field to outside can be prevented.

Figure 11:
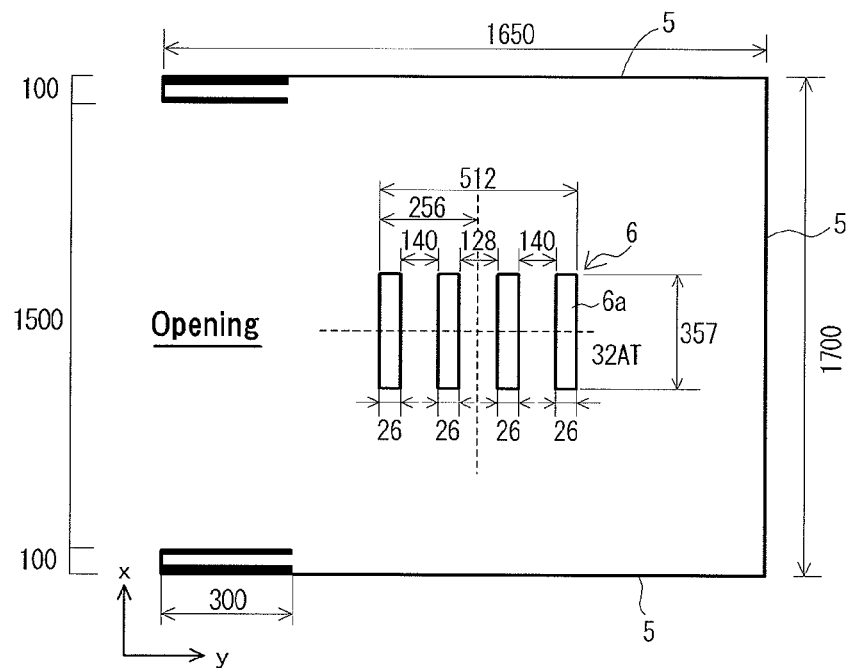
FIG. 11 A diagram showing a non-cylindrical body model.
Figure 12:
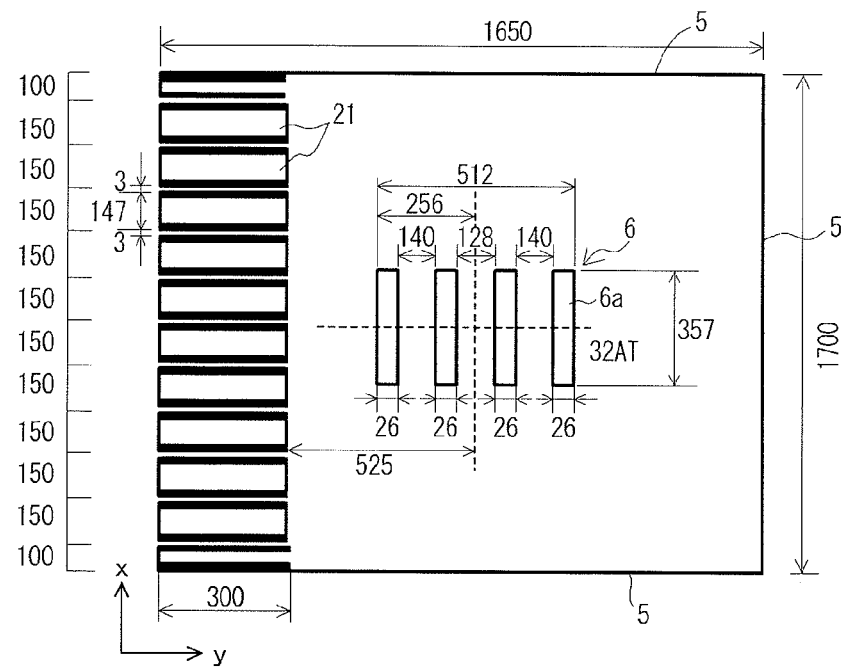
FIG. 12 A diagram showing a non-division model.
Figure 13:
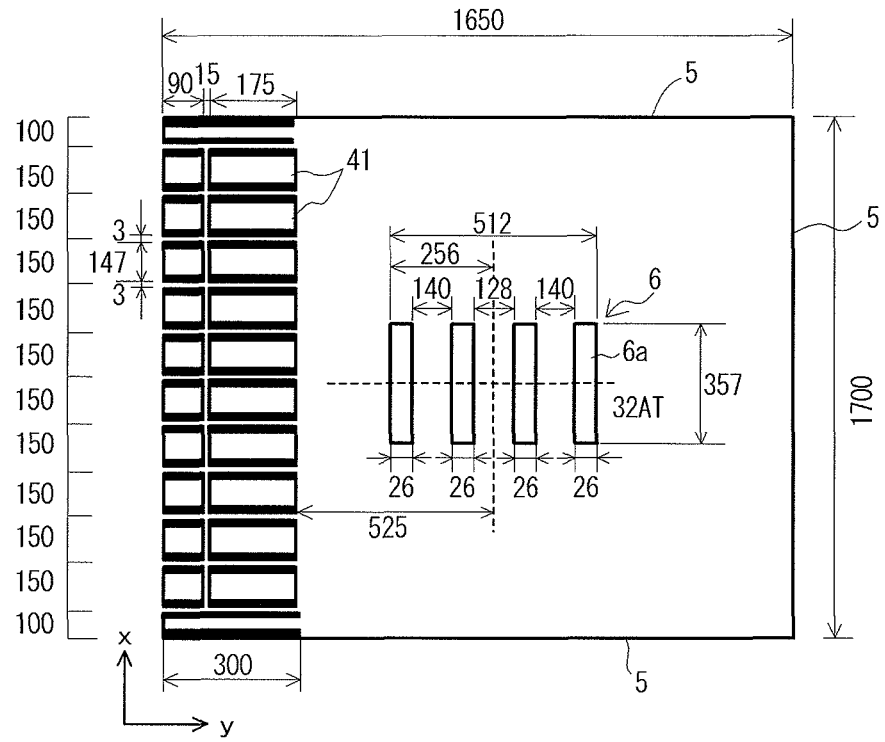
FIG. 13 A diagram showing a two-division model.
Figure 14:
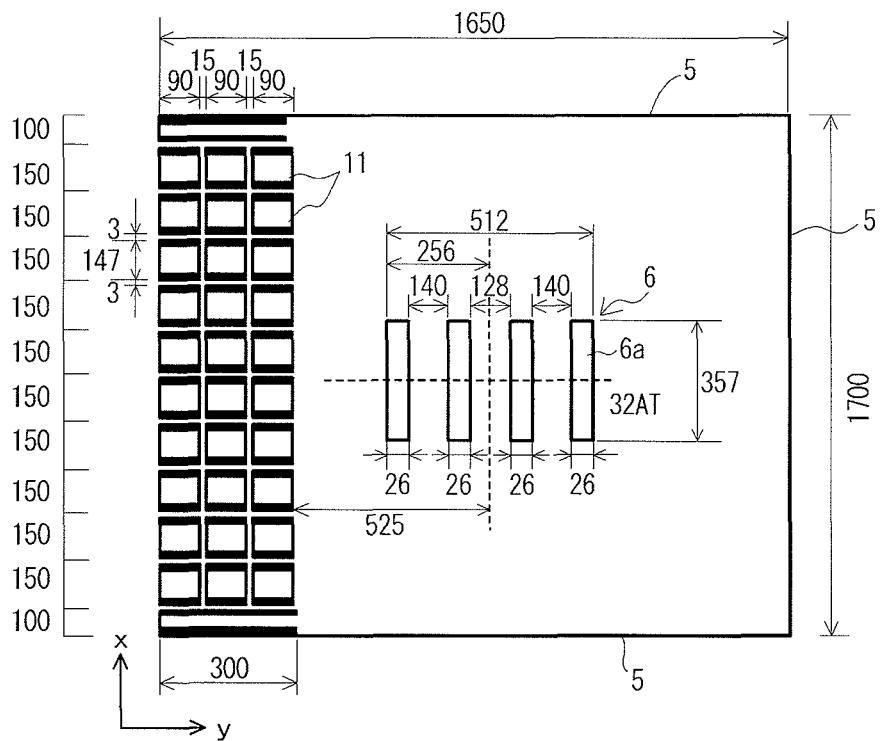
FIG. 14 A diagram showing a three-division model.
Figure 15:
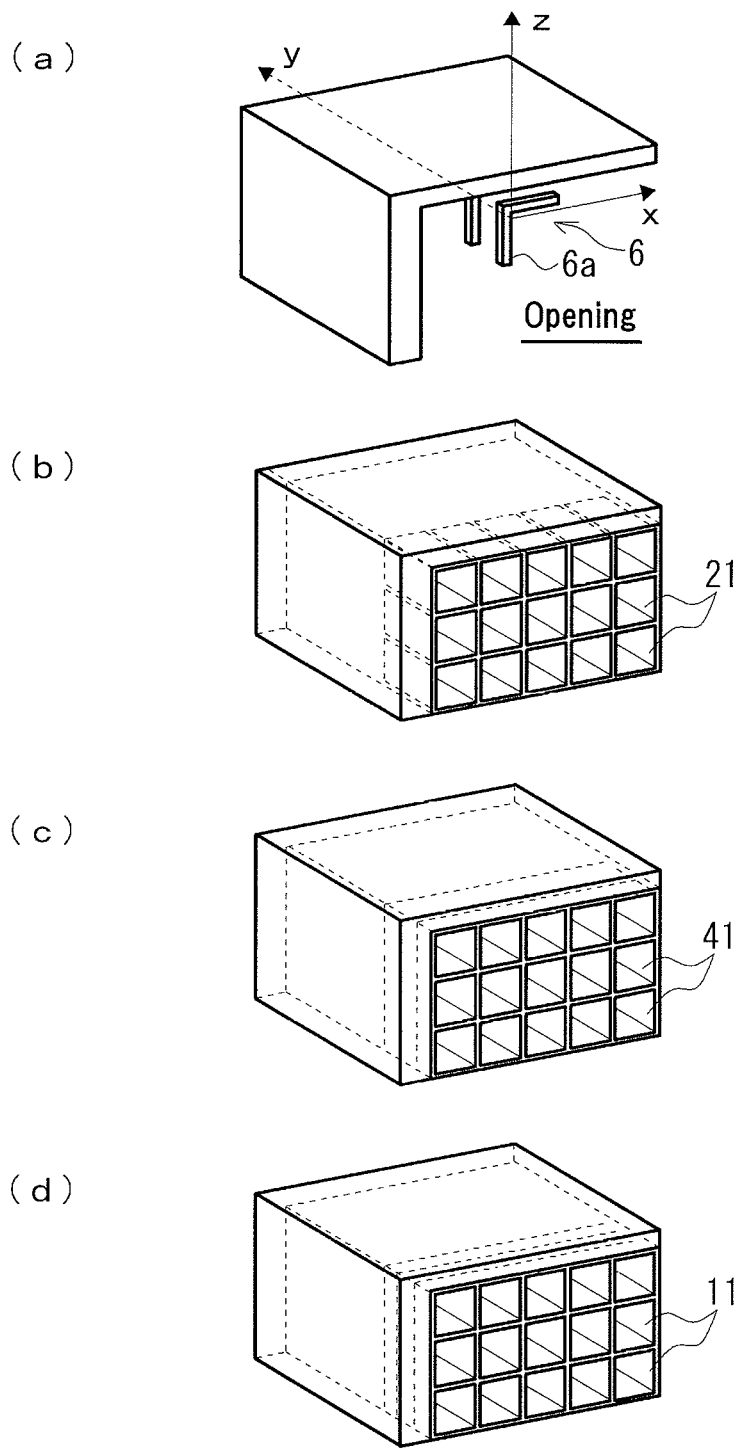
FIG. 15 Diagrams showing ¼ symmetric models, where (a) shows a ¼ symmetric model of the non-cylindrical body model, (b) shows a ¼ symmetric model of the non-division model, Fig. (c) shows a ¼ symmetric model of the two-division model, and (d) shows a ¼ symmetric model of the three-division model.

A result of analysis of a configuration according to the present embodiment is explained next. For models shown in FIGS. 11 to 14, a ¼ symmetric model was created, and a reduction effect of a magnetic field generated by an MRI model was obtained by a three-dimensional magnetic field analysis according to a finite element method. FIG. 11 shows a model (hereinafter "non-cylindrical body model") not provided with a cylindrical body unit. FIG. 12 shows a model (hereinafter, "non-division model") having each of the cylindrical body units not divided as used in the second magnetic shield body 20. FIG. 13 shows a model (hereinafter, "two-division model") arranged with a two-division cylindrical body unit 41. FIG. 14 shows a model (hereinafter, "three-division model") arranged with a three-division cylindrical body unit 11.

Each of the models shown in FIGS. 11 to 14 is a model of the magnetic shield room 1 having a flat square shape of "length 1700 mm×width 1650 mm" (in the following explanations, one of directions along a horizontal surface is called a longitudinal direction or an x direction; a direction along a horizontal surface and orthogonal to the x direction is called a lateral direction or a y direction; and a direction orthogonal to the x direction and the y direction is called a height direction or a z direction). Silicon steel sheets 5 were arranged on five surfaces other than surfaces on which an opening, or the cylindrical body units 11, 21, and 41 were arranged. The thickness of the silicon steel sheet 5 is 1.5 mm in all the models. An MRI model 6 arranged at a plane center position of this magnetic shield room 1 is configured by having four coils 6a of "length 357 mm×width 26 mm" arranged with a mutual interval of 140 mm or 128 mm between the coils 6a. The magnetomotive force of each of the coils 6a is 32 (AT). The distance from a plane center position of this MRI model 6 to an opening or an end surface at an interior side of the cylindrical body units 11, 21, and 41 is 525 mm. A peripheral edge made of a silicon steel sheet of "length 100 mm×width 300 mm" is provided on a peripheral surface of the opening.

In each of the models, the cylindrical body units 11, 21, and 41 have a square cylindrical body shape having "length of 145 mm×height 147 mm", and were formed with a silicon steel sheet of 1 mm, with an adjacent-direction interval of 3 mm. The cylindrical body unit 41 of the two-division model in FIG. 13 has a length of each cylindrical body at a side adjacent to the MRI model 6 as 175 mm, has a length of each cylindrical body at a side isolated from the MRI model 6 as 90 mm, and has an interval between the cylindrical bodies as 15 mm. The cylindrical body unit 11 of the three-division model in FIG. 14 has a length of each cylindrical body as 90 mm, and a mutual interval between the cylindrical bodies as 15 mm.

FIGS. 15(a) to 15(d) show ¼ symmetric models corresponding to each of FIGS. 11 to 14. FIGS. 16 to 19 show results of analysis corresponding to FIGS. 15(a) to 15(d). In FIGS. 16 to 19, (a) shows a position of a measurement line, and (b) shows magnetic field intensity on the measurement line of (a). A lateral axis shows magnetic flux density (the unit is tesla), and a vertical axis shows a height (mm) of the measurement line from an origin. In FIGS. 16 to 19, (b) also shows a result of analysis of a model (hereinafter, "0-relative permeability model") having relative permeability in the y direction set to 0 in the non-division model in FIG. 12.

Figure 16:
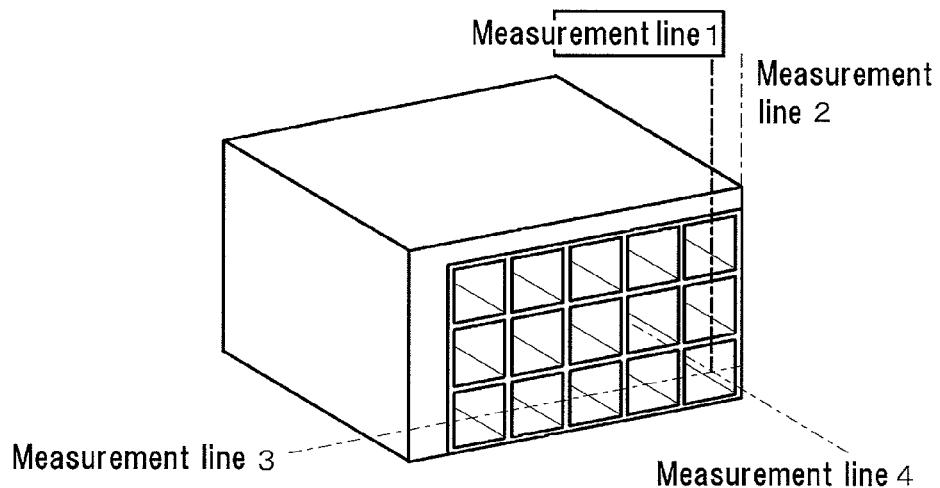
FIG. 16 Diagrams showing results of analysis of the non-cylindrical body model, where (a) shows a position of a measurement line and (b) shows magnetic field intensity on the measurement line of (a).
Figure 16:
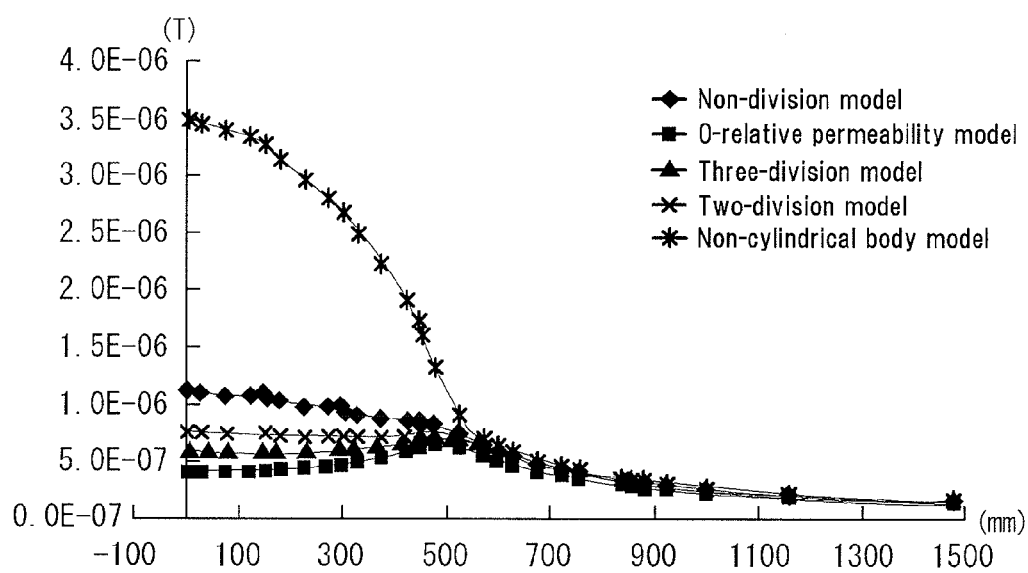
Figure 17:
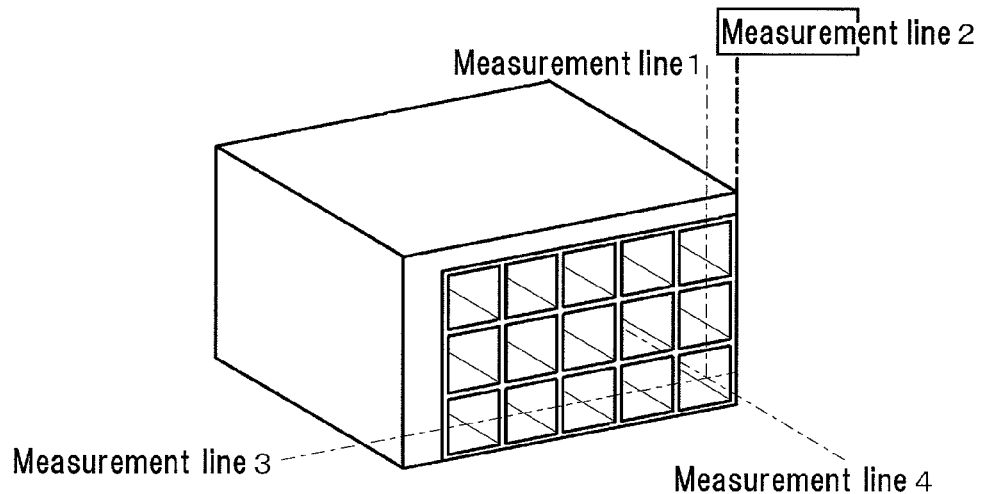
FIG. 17 Diagrams showing results of analysis of the non-division model, where (a) shows a position of a measurement line and (b) shows magnetic field intensity on the measurement line of (a).
Figure 17:
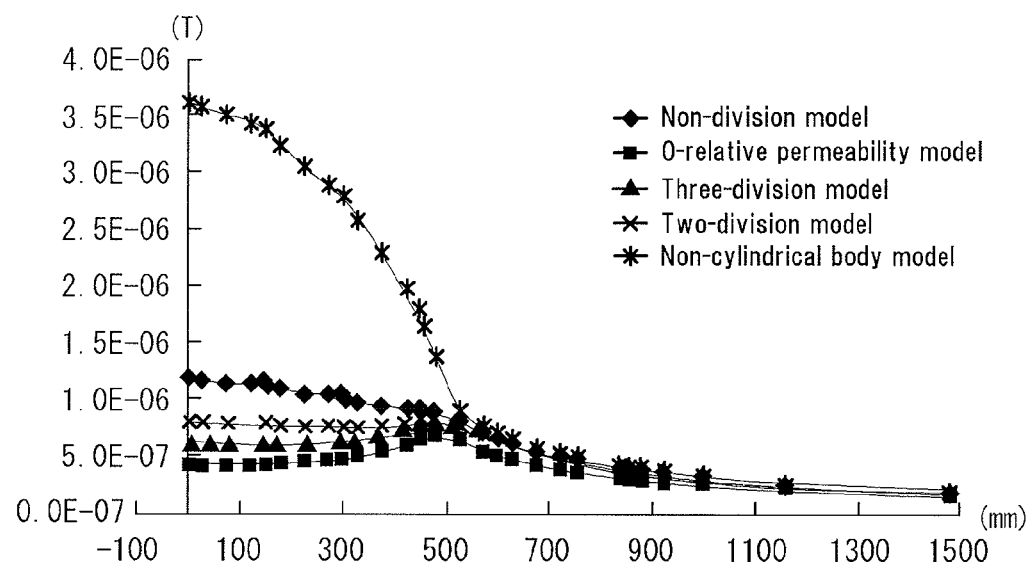
Figure 18:
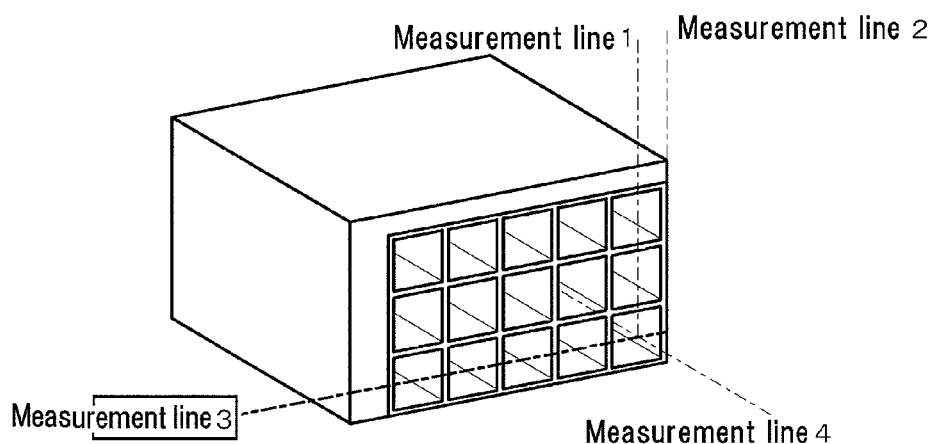
FIG. 18 Diagrams showing results of analysis of the two-division model, where (a) shows a position of a measurement line and (b) shows magnetic field intensity on the measurement line of (a).
Figure 18:
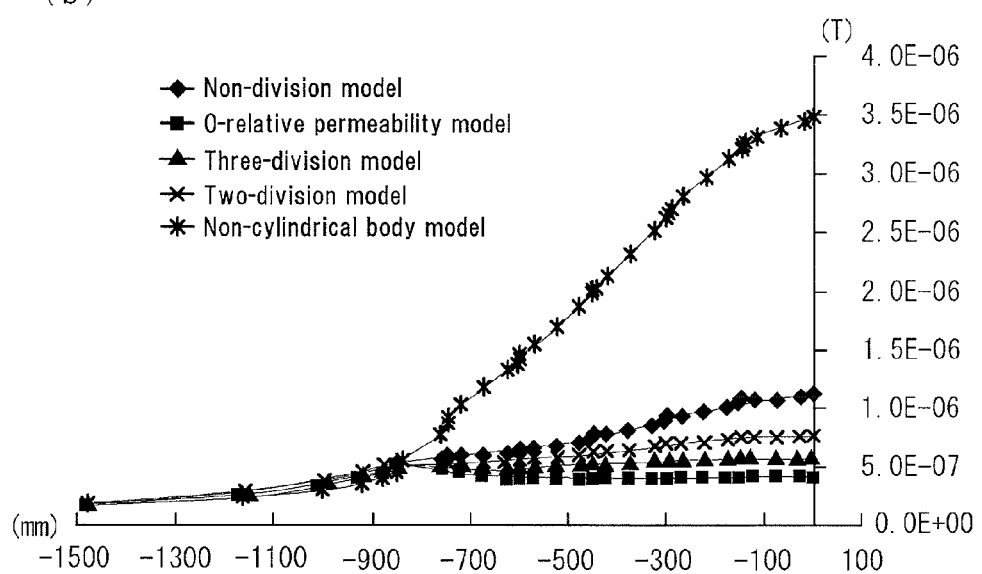
Figure 19:
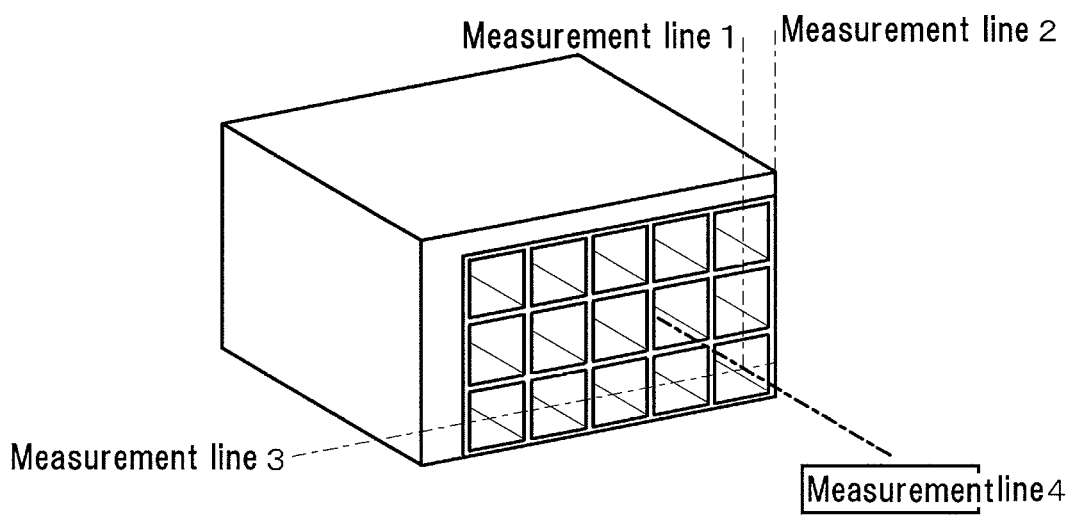
FIG. 19 Diagrams showing results of analysis of the three-division model, where (a) shows a position of a measurement line and (b) shows magnetic field intensity on the measurement line of (a).
Figure 19:
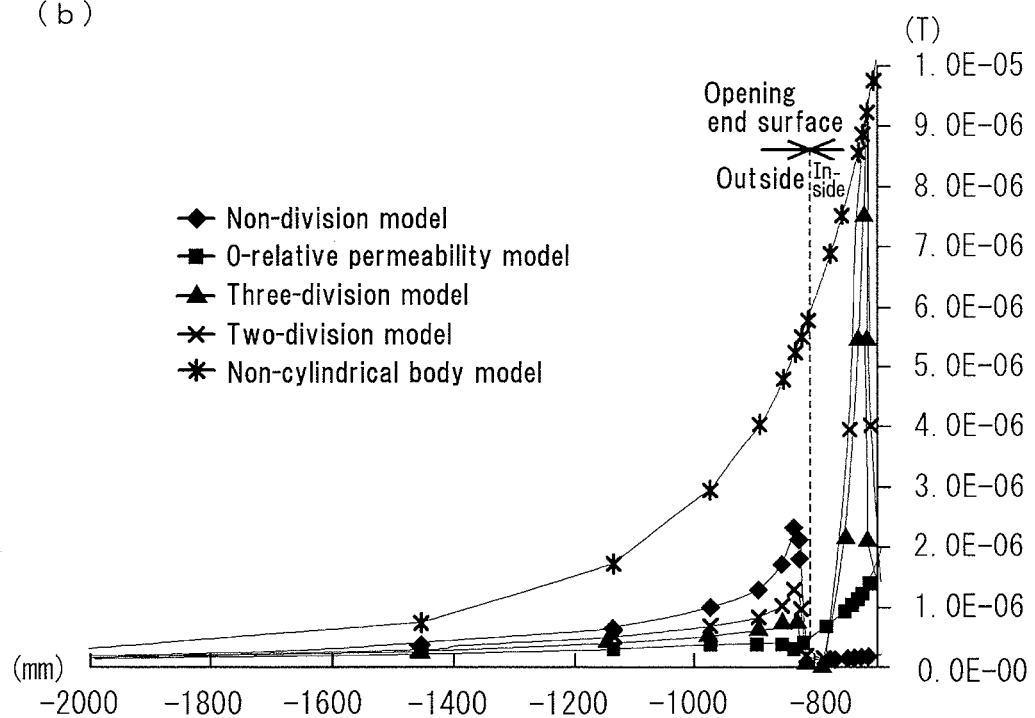

First, with reference to FIGS. 16 to 18, it can be understood that leakage of a magnetic field to outside can be reduced to about equal to or lower than ⅔ in the two-division model, and can be reduced to about equal to or lower than ½ in the three-division model, as compared with the non-division model, respectively. With reference to FIGS. 18 and 19, it can be understood that leakage of a magnetic field to outside can be reduced in the three-division model as compared with the two-division model, and can be further reduced in the 0-relative permeability model.

With reference to FIG. 19, leakage of a magnetic field becomes sequentially small in the order of "0-relative permeability model>three-division model>two-division model>non-division model", at inside of an opening end surface (inside of the cylindrical body units 11, 21, and 41). It can be understood from the above that in the non-division model, a magnetic field in an internal space of the cylindrical body unit 21 becomes small by collecting a magnetic flux within a magnetic material constituting the cylindrical body unit 21, and on the other hand, that in the two-division model and the three-division model, a magnetic flux is not collected within the magnetic material, but the magnetic flux shifts toward the cylindrical body units 11 and 41 adjacent with each other.

On the other hand, in FIG. 19, leakage of a magnetic field becomes sequentially small in the order of "non-division model>two-division model>three-division model>0-relative permeability model" at outside of an opening end surface (outside of the cylindrical body units 11, 21, and 41). It can be understood from the above that in the non-division model, after a magnetic flux is collected within the magnetic material constituting the cylindrical body unit 21, an amount of a magnetic flux induced to the axial direction (the y direction) and discharged to outside of the magnetic shield room 1 from the opening end surface is large, and on the other hand, that in other models, a magnetic flux is not collected within the magnetic material, but as a result of a magnetic flux being induced toward the cylindrical body units 11 and 41 adjacent to each other, an amount of a magnetic flux discharged from the opening end surface to outside of the magnetic shield room 1 is small.

Example 2

Figure 20:
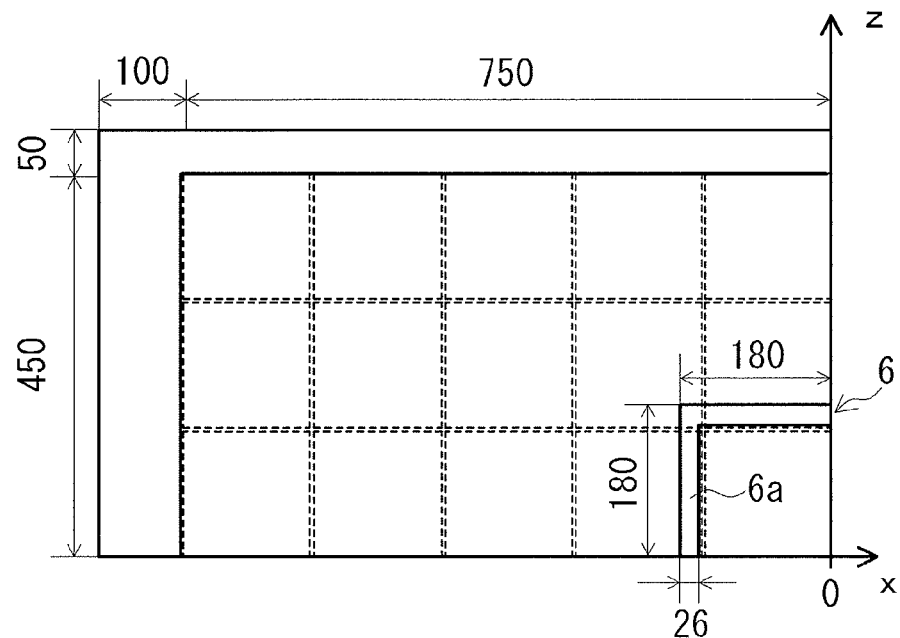
FIG. 20 A view common to each of models according to an Example 2, and a front view having a cylindrical body unit viewed from an MRI model side.
Figure 21:
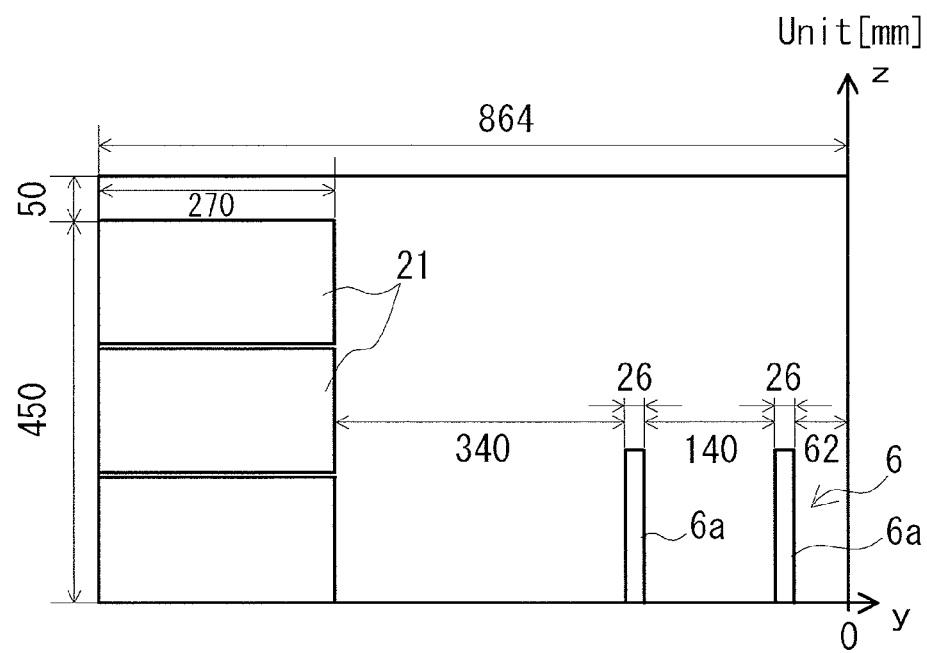
FIG. 21 A side view of the non-division model.
Figure 22:
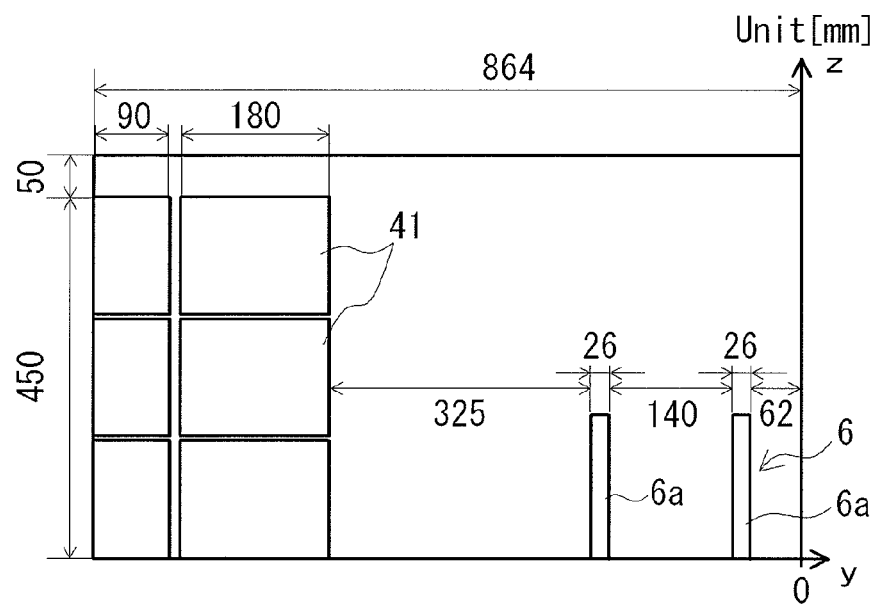
FIG. 22 A side view of the two-division model.
Figure 23:
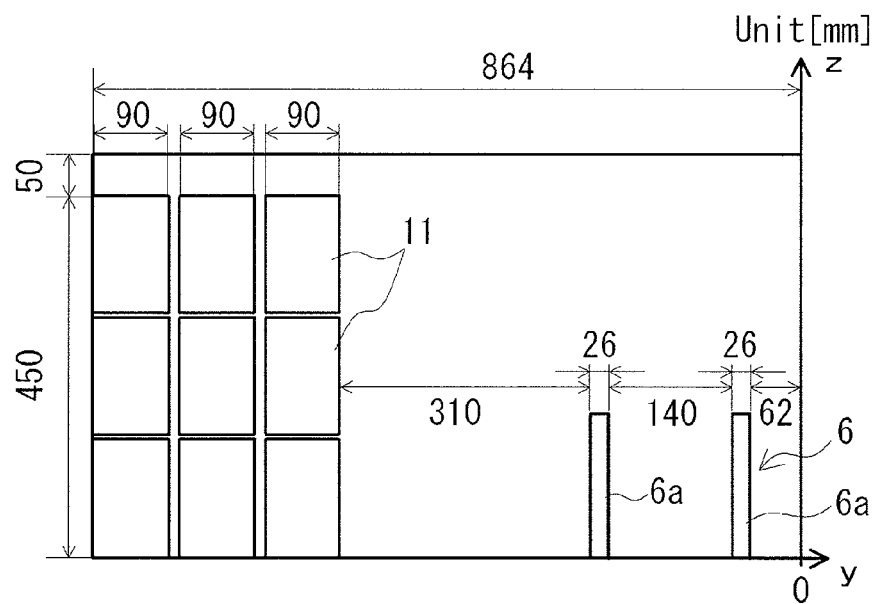
FIG. 23 A side view of the three-division model.

An Example 2 is explained next. In the Example 2, operating conditions are identical to those of the Example 1 described above unless otherwise specified. In the Example 2, three kinds of ⅛ symmetric models including a non-division model, a two-division model, and a three-division model were created, and a reduction effect of a magnetic field generated by an MRI model was obtained by a three-dimensional magnetic field analysis by a finite element method. FIG. 20 is a view common to each of the models and is a front view having a cylindrical body unit viewed from an MRI model side along the x direction, FIG. 21 is a side view of the non-division model, FIG. 22 is a side view of the two-division model, and FIG. 23 is a side view of the three-division model. The dimension of the models is "length 750 mm×width 864 mm×height 450 mm". The MRI model 6 had two coils 6a of "length 180 mm×width 26 mm×height 180 mm" arranged with an interval of 140 mm. The distance from the MRI model 6 to an end surface of the interior side of the cylindrical body units 11, 21, and 41 is 340 mm for the non-division model (the cylindrical body unit 21), 325 mm for the two-division model (the cylindrical body unit 41), and 310 mm for the three-division model (the cylindrical body unit 11). As shown in FIG. 20, peripheral edges made of a silicon steel sheet of "length 750 mm×height 50 mm" and "length 100 mm×height 450 mm" are provided on a peripheral surface of the opening.

Each of the cylindrical body units 11, 21, and 41 had a thickness of 1 mm for a surface parallel to an xy direction, and a thickness of 1 mm for a surface parallel to a yz direction. In the non-division model in FIG. 21, the dimension of the cylindrical body unit 21 is "length 142 mm×width 270 mm×height 142 mm". In the two-division model in FIG. 22, the dimension of a cylindrical body at a side adjacent to the MRI model 6 is "length 142 mm×width 195 mm×height 142 mm", and the dimension of a cylindrical body at a side isolated from the MRI model 6 is "length 142 mm×width 90 mm×height 142 mm". These cylindrical bodies are arranged with a mutual interval of 15 mm from each other. In the three-division model in FIG. 23, three cylindrical bodies each having the dimension of "length 142 mm×width 90 mm×height 142 mm" are arranged with a mutual interval of 15 mm from each other.

Figure 24:
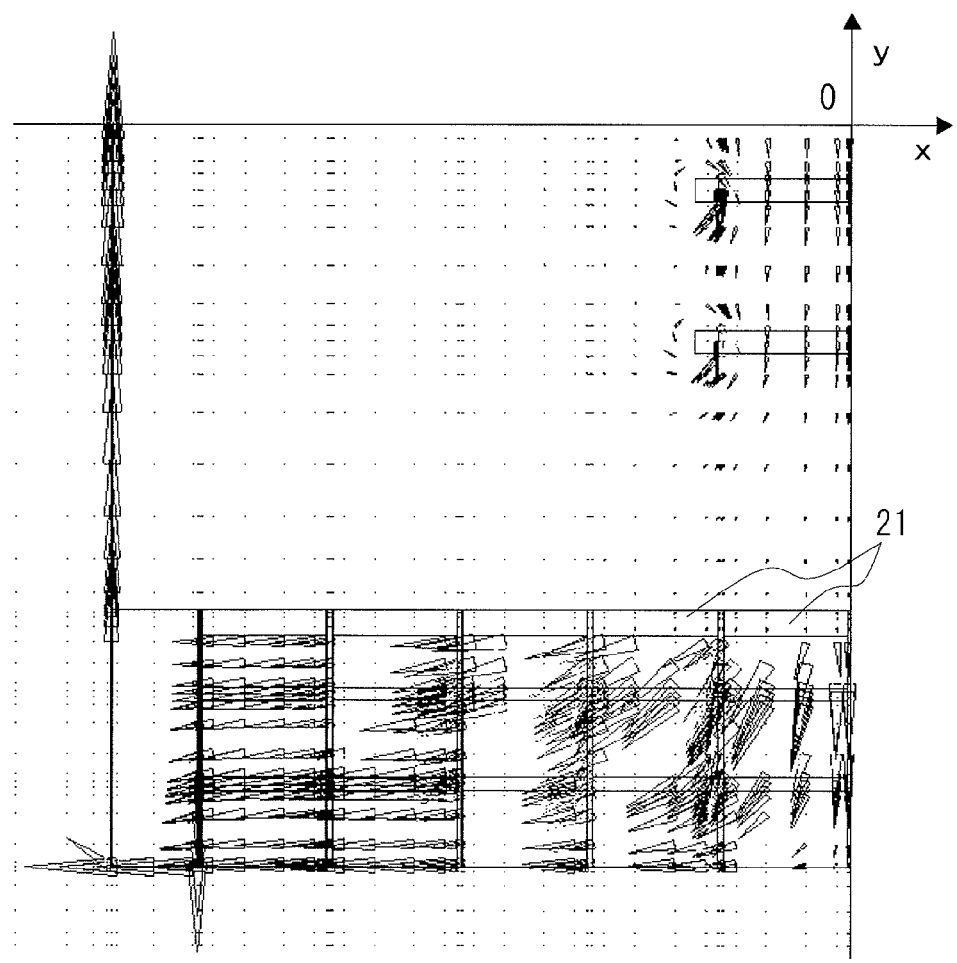
FIG. 24 A diagram showing a result of analysis of the non-division model.
Figure 25:
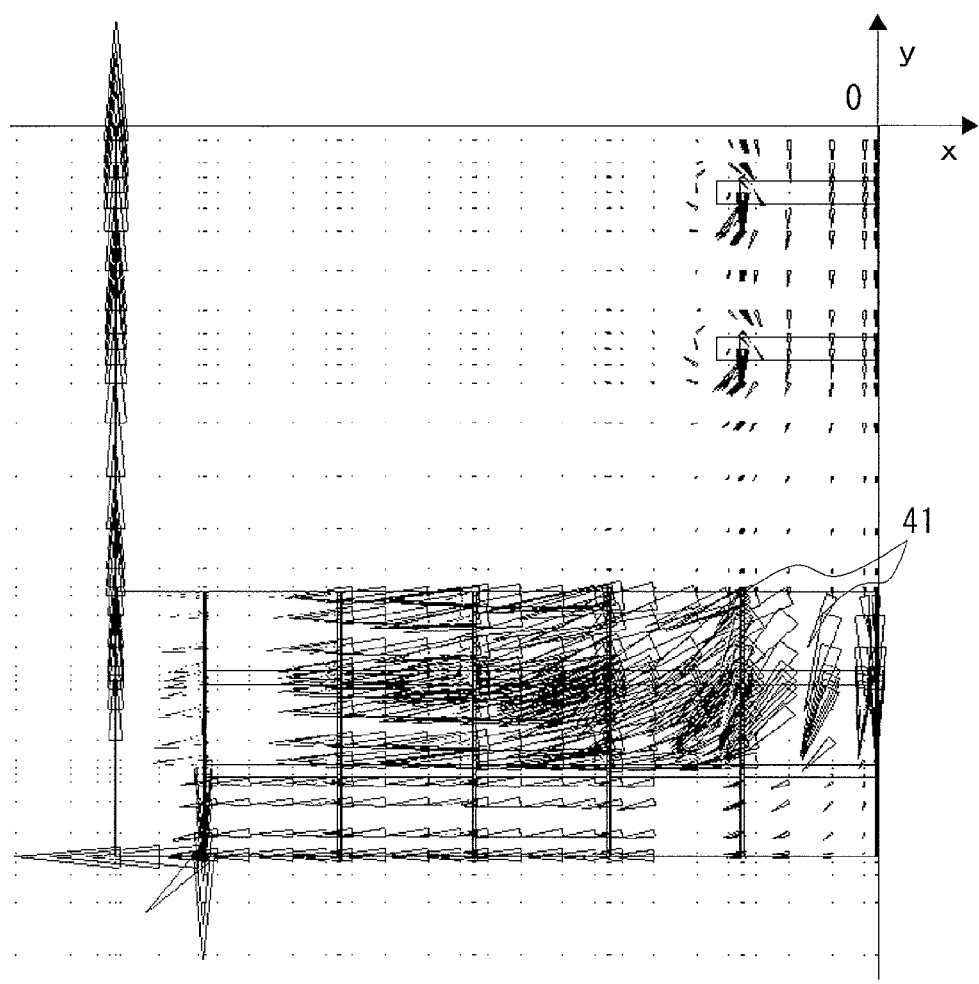
FIG. 25 A diagram showing a result of analysis of the two-division model.
Figure 26:
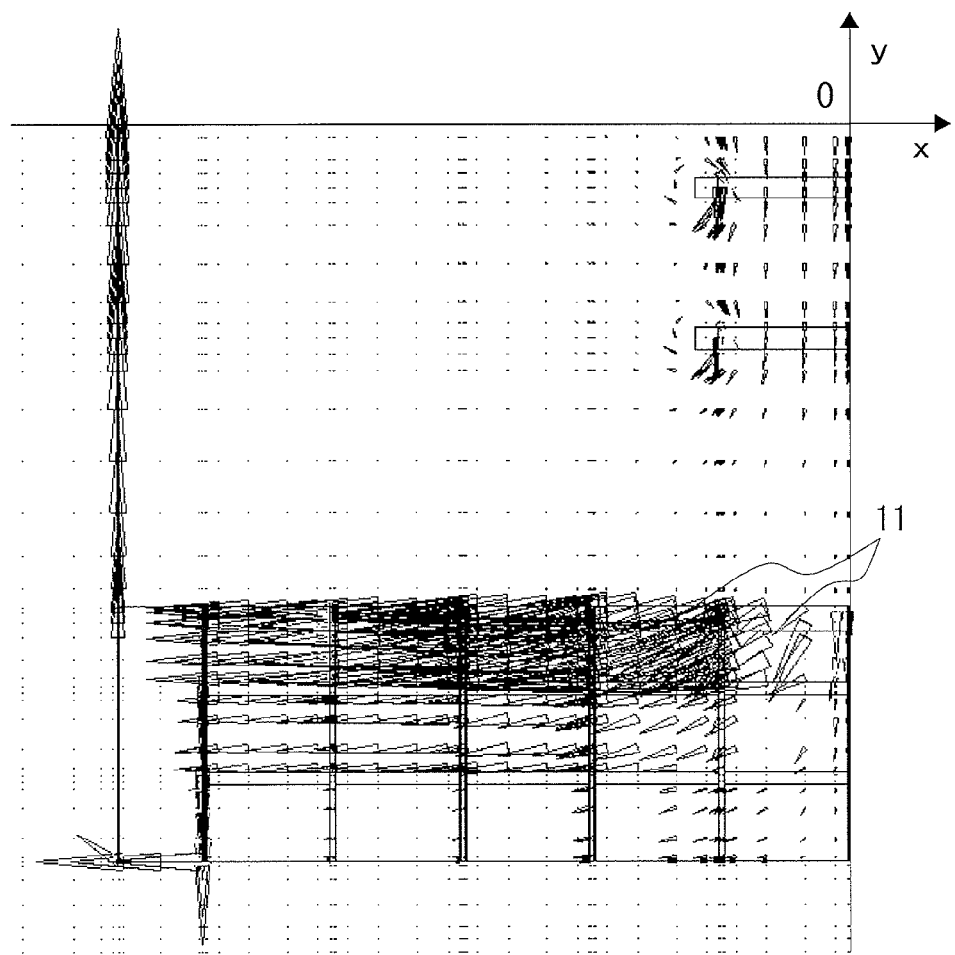
FIG. 26 A diagram showing a result of analysis of the three-division model.

FIG. 24 shows a result of analysis of the non-division model in FIG. 21, FIG. 25 shows a result of analysis of the two-division model in FIG. 22, and FIG. 26 shows a result of analysis of the three-division model in FIG. 23. Each of the drawings shows a result of analysis of a three-dimensional magnetic field in a material and in air on a plane parallel to the xy direction with a height 3.25 mm from a bottom surface (z=0). In FIGS. 24 to 26, a size and a direction of a magnetic flux are shown by a triangle, respectively. By comparing FIG. 24 with FIG. 25 and FIG. 26, it can be understood that more magnetic fields are bypassed along an adjacent direction (the x direction) after being absorbed by the cylindrical body units 11, 21, and 41, in the two-division model and the three-division model than magnetic fields in the non-division model, and that an amount of magnetic fields reaching outside along the axial direction (the y direction) of the cylindrical body units 11, 21, and 41 is more reduced in the two-division model and the three-division model than an amount in the non-division model. Particularly, as FIG. 25 is compared with FIG. 26, it can be understood that more magnetic fields are bypassed along an adjacent direction in the three-division model than magnetic fields in the two-division model, and that an amount of magnetic fields reaching an external end of the cylindrical body units 11, 21, and 41 is more reduced in the three-division model than an amount in the two-division model.

Therefore, it can be understood that the shielding effect of a magnetic field to outside can be increased by dividing the cylindrical body units 11, 21, and 41, and that this effect is higher when the cylindrical body units 11, 21, and 41 are divided into three than the effect when these cylindrical body units are divided into two. For the same reason, even when a total length of each of the cylindrical body units 11, 21, and 41 is the same, for example, when the number of divisions is increased, a magnetic flux becomes small in stages toward an external cylindrical body, and the shielding effect of a magnetic field to outside can be increased.

Example 3

An Example 3 is explained next. In the Example 3, operating conditions are identical to those of the Example 1 described above unless otherwise specified. In the Example 3, a model shown in FIG. 27(a) was created, and a reduction effect of a magnetic field generated by an MRI model was obtained by a model experiment. Analysis was performed for a non-cylindrical body model, a non-division model shown in FIG. 27(a), a model (hereinafter, "15 mm-pitch three-division model") obtained by dividing each of the cylindrical body units into three, and having a mutual interval of 15 mm between the divided cylindrical body units as shown in FIG. 27(b), a model (hereinafter, "30 mm-pitch three-division model") obtained by dividing each of the cylindrical body units into three, and having a mutual interval of 30 mm between the divided cylindrical body units as shown in FIG. 27(c), and a model (hereinafter, "30 mm-pitch two-division alternate model") obtained by dividing each of the cylindrical body units into two, having a mutual interval of 30 mm between the divided cylindrical body units, and having division positions alternately between adjacent cylindrical body units as shown in FIG. 27(d).

Figure 27:
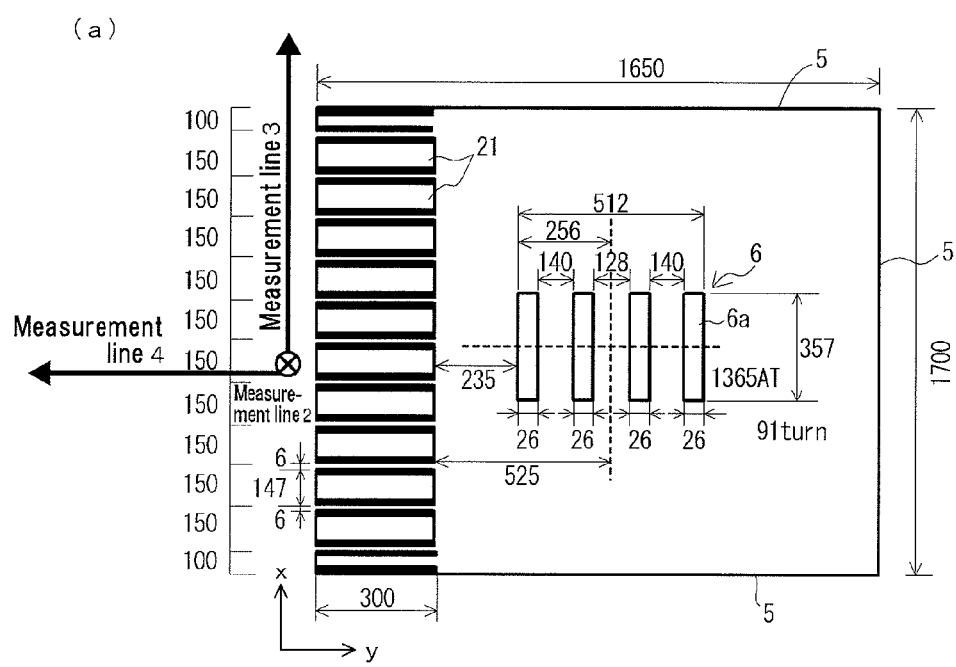
FIG. 27 Diagrams of models according to an Example 3, where (a) shows a non-division model, (b) shows a 15 mm-pitch three-division model, (c) shows a 30 mm-pitch three-division model, and (d) shows a 30 mm-pitch two-division alternate model.
Figure 27:
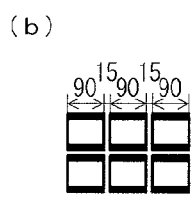
Figure 27:
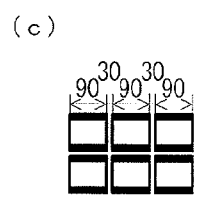
Figure 27:
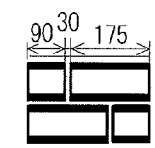
Figure 28:
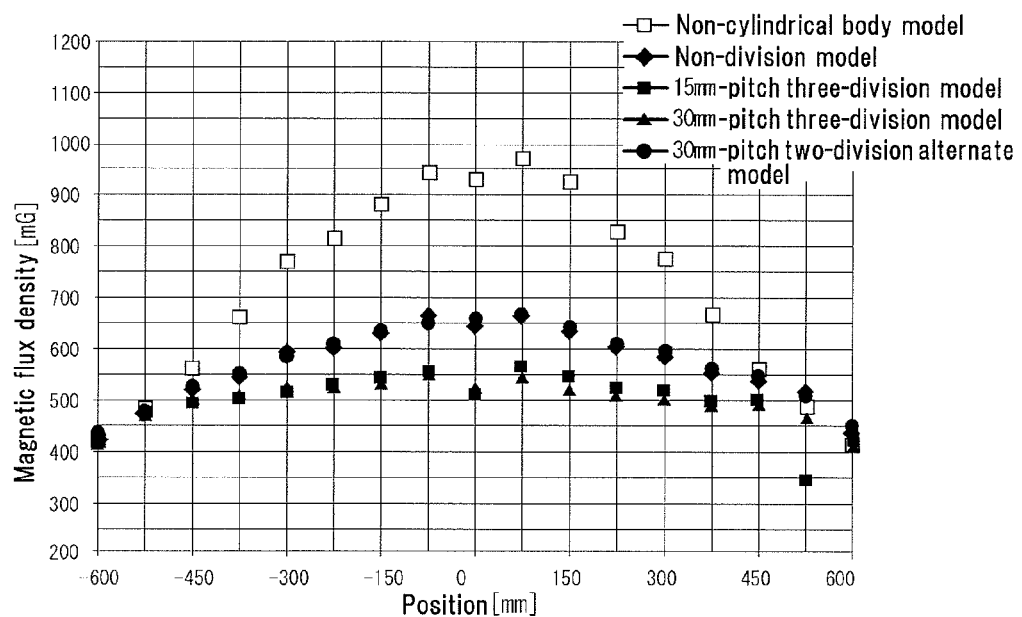
FIG. 28 A diagram showing magnetic field intensity on a line of a measurement line 2 shown in FIG. 27(a).
Figure 29:
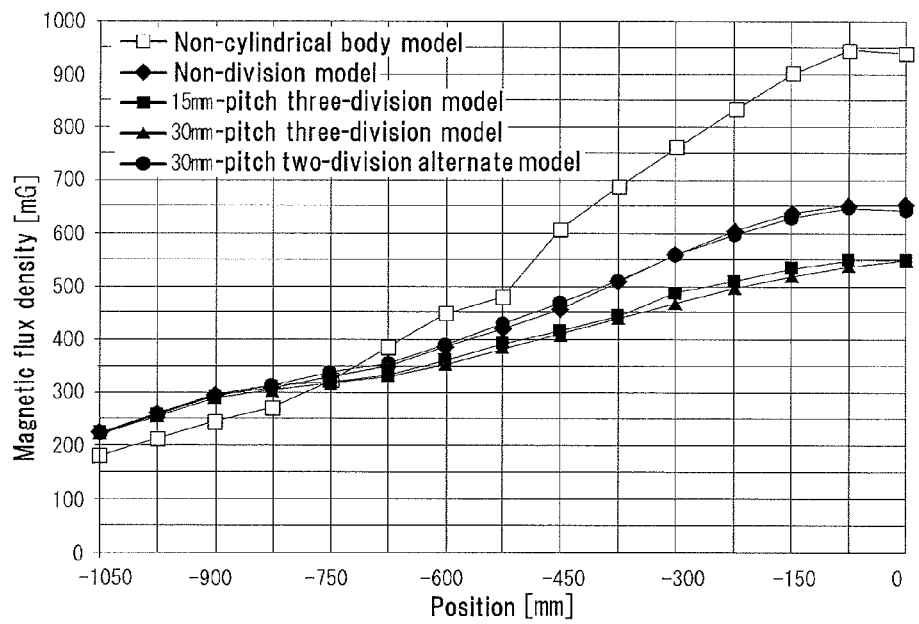
FIG. 29 A diagram showing magnetic field intensity on a line of a measurement line 3 shown in FIG. 27(a).
Figure 30:
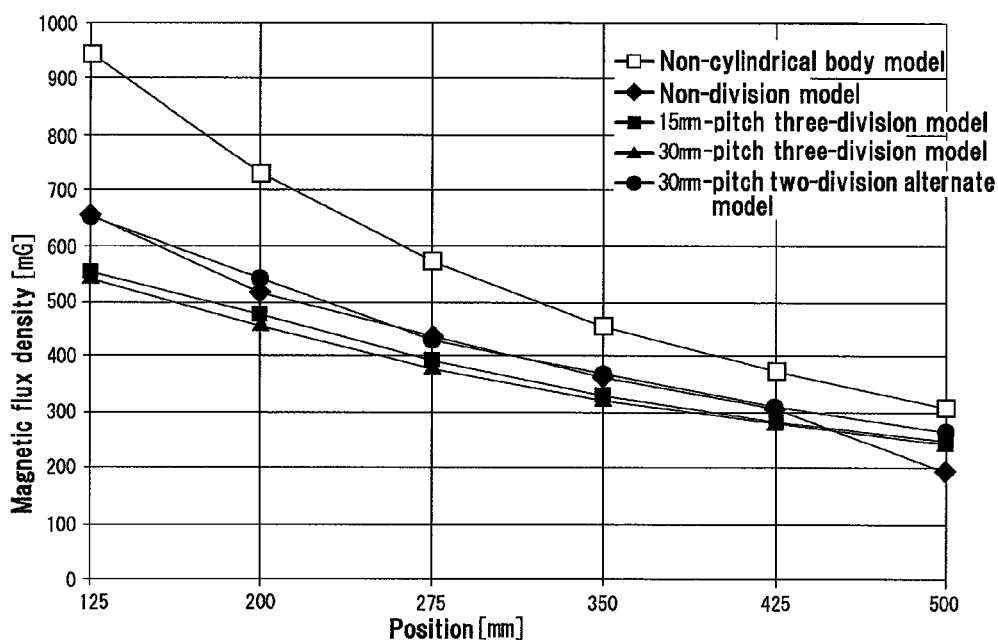
FIG. 30 A diagram showing magnetic field intensity on a line of a measurement line 4 shown in FIG. 27(a).
Figure 31:
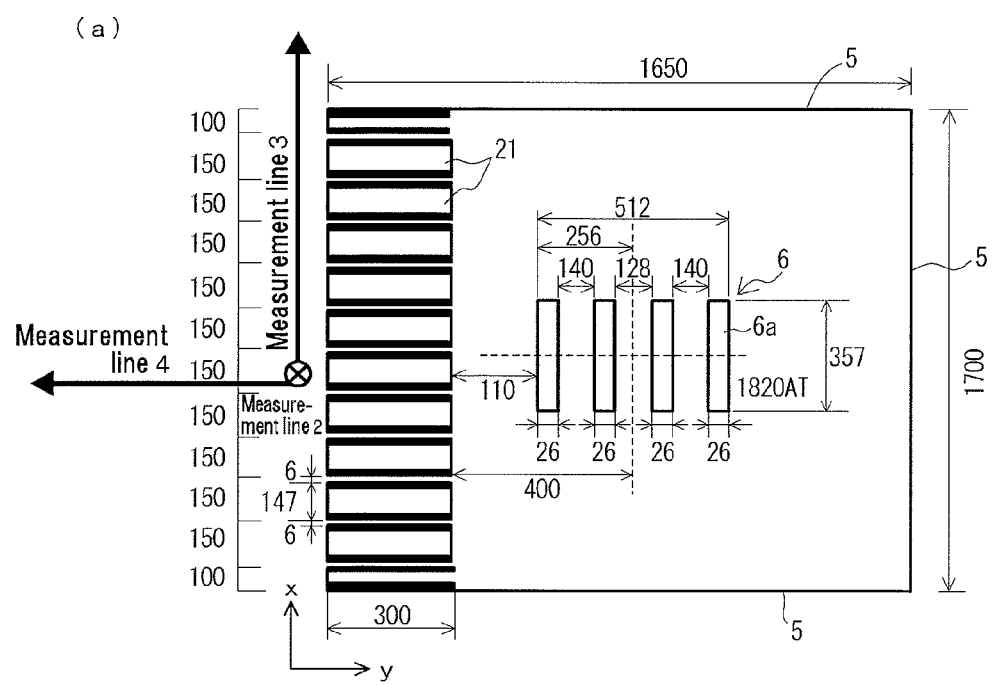
FIG. 31 Diagrams of models according to an Example 4, where (a) shows a non-division model, and (b) to (f) show models obtained by dividing each of cylindrical body units into three and each models having a mutual interval between the divided cylindrical body units as 3 mm, 6 mm, 15 mm, 30 mm, and 40 mm, respectively.
Figure 31:
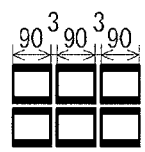
Figure 31:
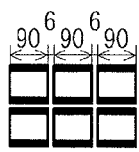
Figure 31:
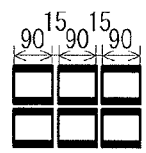
Figure 31:
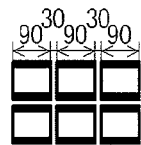
Figure 31:
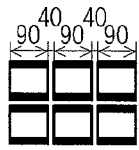

FIG. 28 shows magnetic field intensity on a line of a measurement line 2 (a line extended upward (a plus side) and downward (a minus side) along a z-axis, with a center vicinity position in a z-axis direction of a model as an origin) shown in FIG. 27(a). FIG. 29 shows magnetic field intensity on a line of a measurement line 3 (a line extended along an x-axis from the same origin as that of the measurement line 2) shown in FIG. 27(a). FIG. 30 shows magnetic field intensity on a line of a measurement line 4 (a line extended along a y-axis from the same origin as that of the measurement line 2) shown in FIG. 27(a). In FIGS. 28 to 30, a lateral axis shows a distance (mm) from the origin of the measurement line, and a vertical axis shows magnetic flux density (unit is mG). As is clear from FIGS. 28 to 30, validity of the cylindrical body unit can be understood because magnetic flux density is higher in all models than magnetic flux density in the non-cylindrical body model. The non-division model and the 30 mm-pitch two-division alternate model have substantially the same magnetic flux reduction effect, and have a lower magnetic flux reduction effect than that in the 15 mm-pitch three-division model and the 30 mm-pitch three-division model. When the cylindrical body units are alternately arranged, even if the cylindrical body units are divided, it can be understood that the magnetic flux reduction effect cannot be increased so much. It can be considered that this is because magnetic flux propagation to an adjacent direction of the cylindrical body units is not performed smoothly when the cylindrical body units are arranged alternately. Therefore, it is preferable to smoothly perform magnetic flux propagation to an adjacent direction of cylindrical body units by arranging such that a mutual interval between cylindrical bodies constituting a cylindrical body unit and a mutual interval between cylindrical bodies constituting other cylindrical body unit arranged adjacently to the cylindrical body unit are arranged at mutually adjacent positions, in a similar manner to that in the 15 mm-pitch three-division model and the 30 mm-pitch three-division model.

Example 4

Finally, an Example 4 is explained. In the Example 4, operating conditions are identical to those of the Example 1 described above unless otherwise specified. In this case, a model shown in FIG. 31(a) was created, and a reduction effect of a magnetic field generated by an MRI model was obtained by a model experiment. The magnetomotive force of each of the coils 6a is 1820 (AT). The distance from a plane center position of this MRI model 6 to an opening or an end surface at an interior side of a cylindrical body unit is 400 mm. Analysis was performed for a non-cylindrical body model, a non-division model shown in FIG. 31(a), and models obtained by dividing each of the cylindrical body units into three and each model having a mutual interval between the divided cylindrical body units as 3 mm, 6 mm, 15 mm, 30 mm, and 40 mm (hereinafter, "3 mm-pitch three-division model", "6 mm-pitch three-division model", "15 mm-pitch three-division model", "30 mm-pitch three-division model", and "40 mm-pitch three-division model") as shown in FIGS. 31(b) to 31(f).

Figure 32:
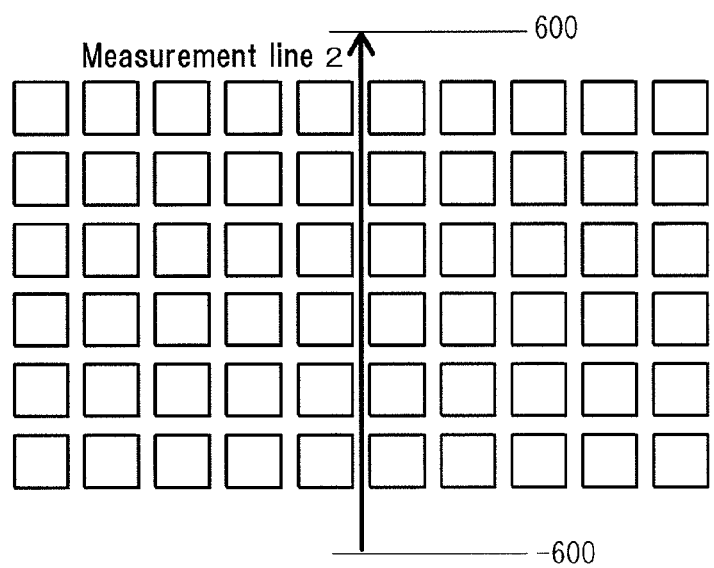
FIG. 32 A diagram showing the measurement line 2.
Figure 33:
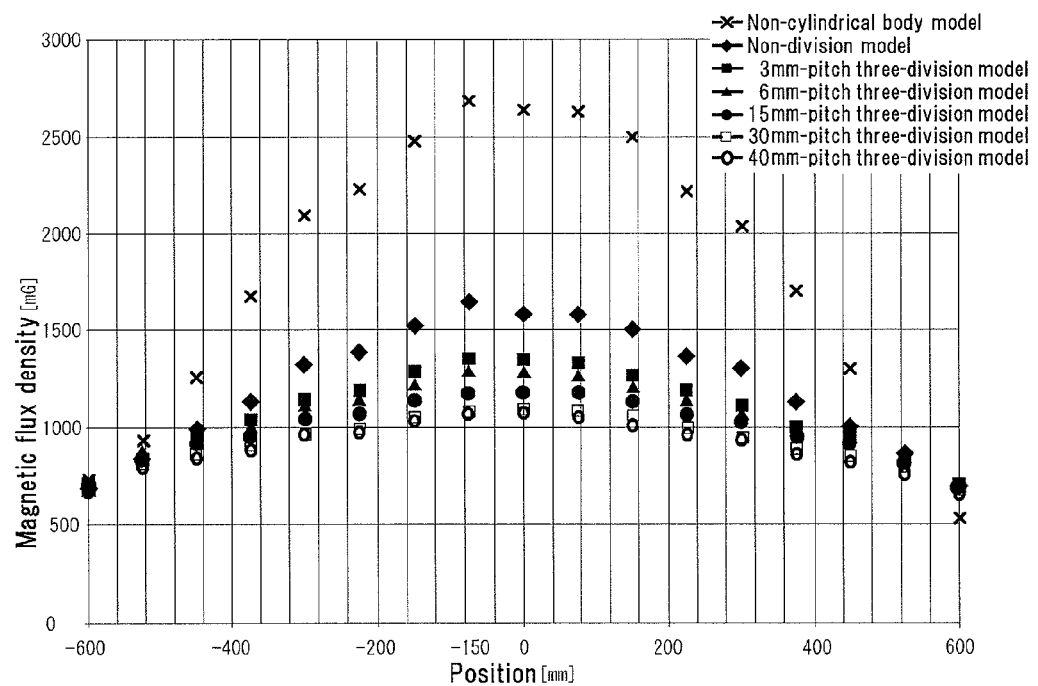
FIG. 33 A diagram showing magnetic field intensity on a line of the measurement line 2 shown in FIG. 32.
Figure 34:
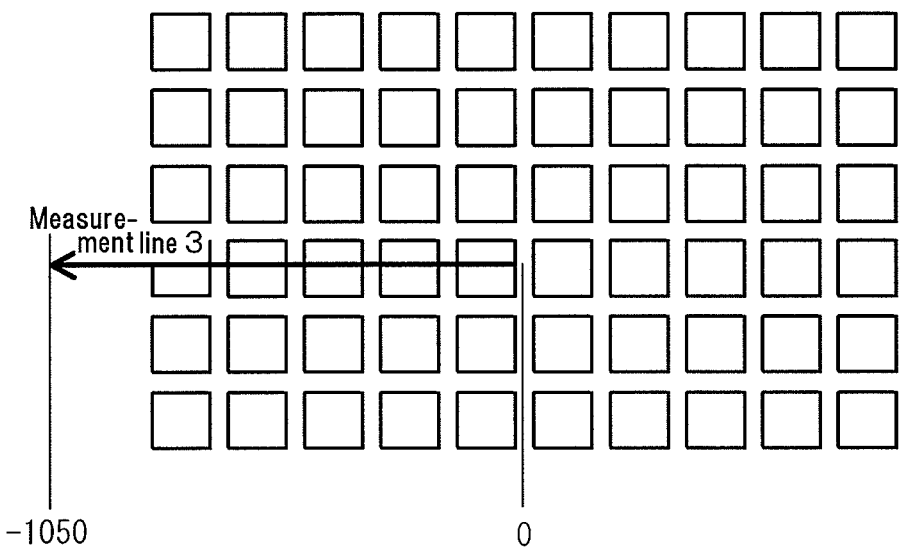
FIG. 34 A diagram showing the measurement line 3.
Figure 35:
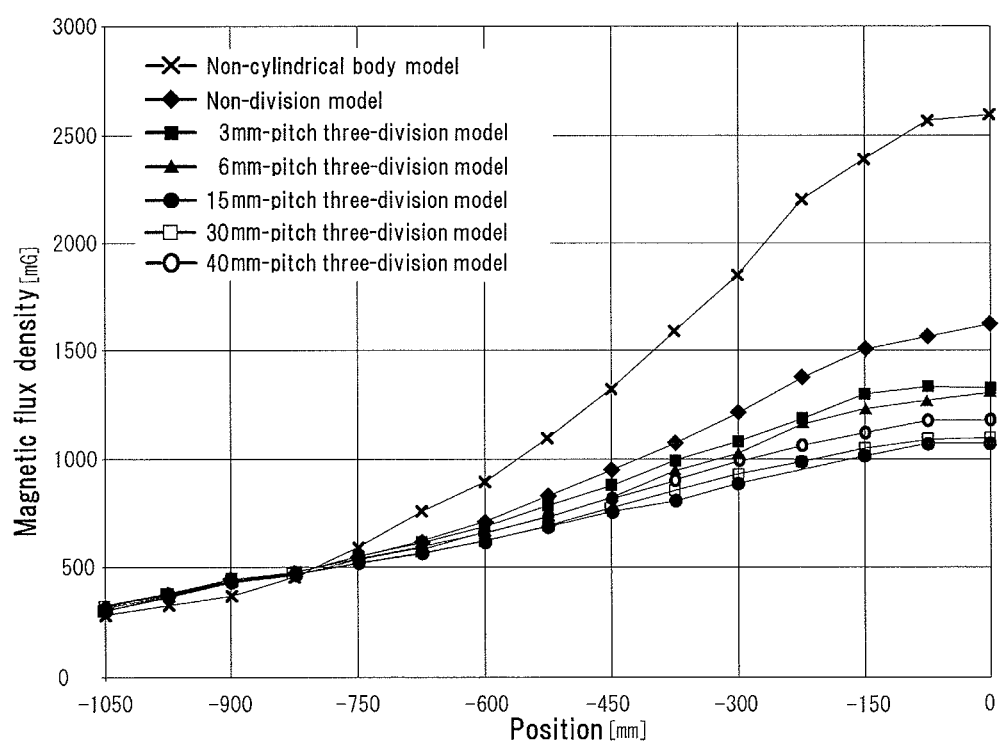
FIG. 35 A diagram showing magnetic field intensity on a line of the measurement line 3 shown in FIG. 34.
Figure 36:
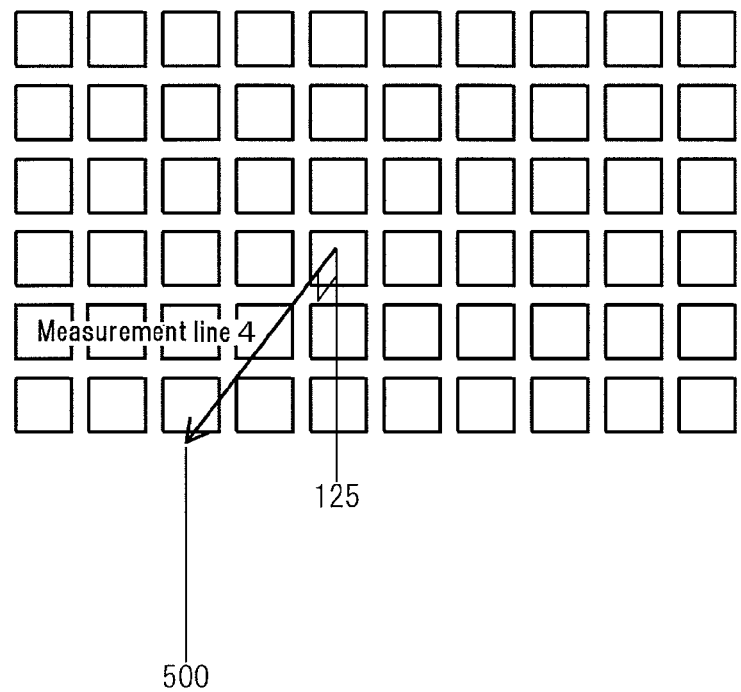
FIG. 36 A diagram showing the measurement line 4.
Figure 37:
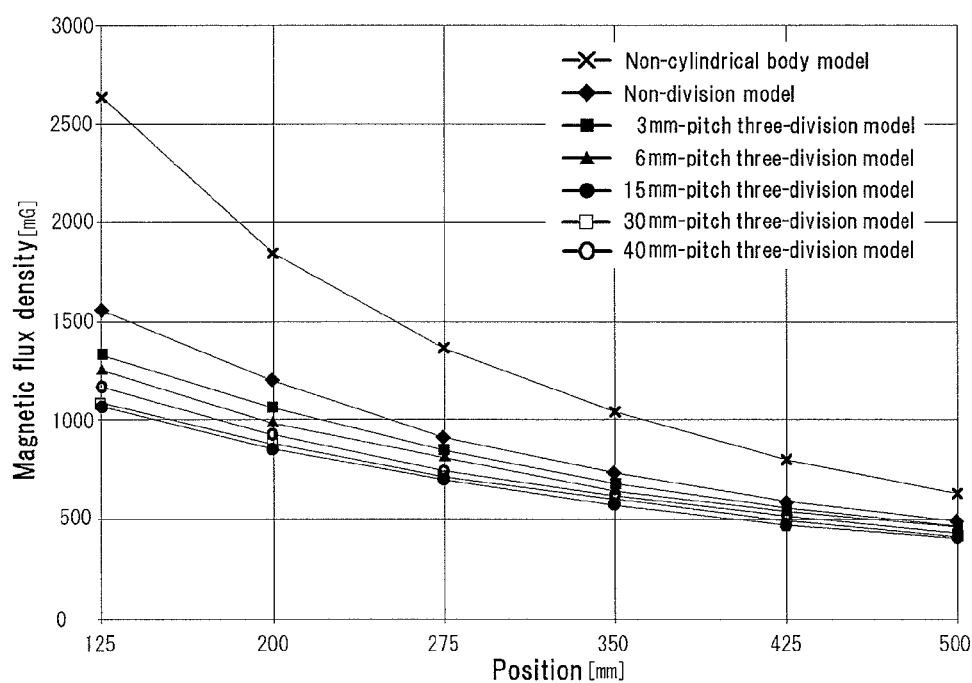
FIG. 37 A diagram showing magnetic field intensity on a line of the measurement line 4 shown in FIG. 36.
Figure 38:
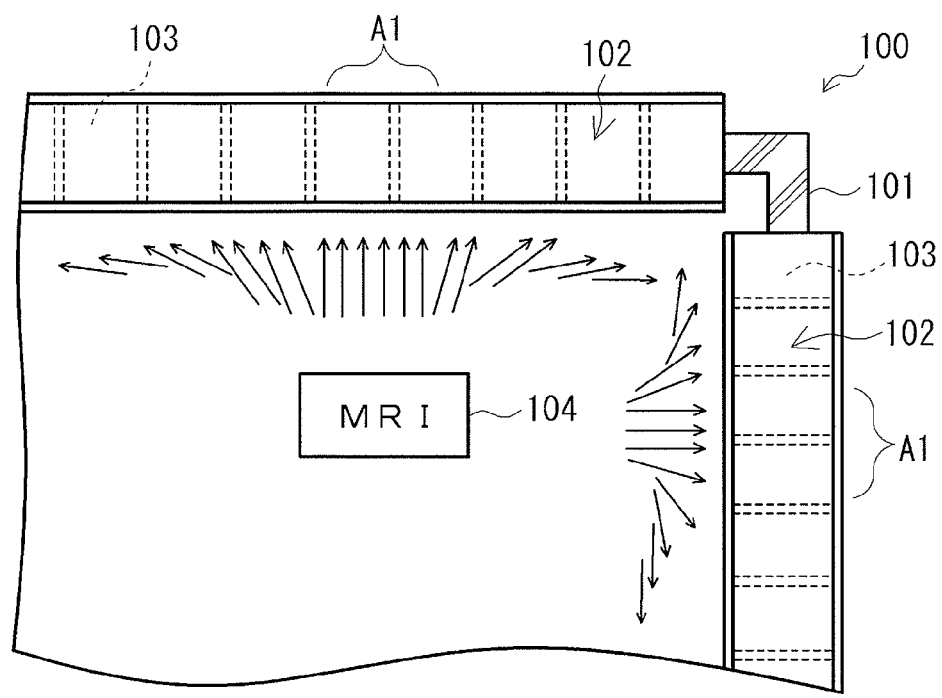
FIG. 38 A plan view of relevant parts of a conventional MRI room.

FIG. 33 shows magnetic field intensity on a line of the measurement line 2 shown in FIG. 32. Similarly, FIG. 35 shows magnetic field intensity on a line of the measurement line 3 shown in FIG. 34, and FIG. 37 shows magnetic field intensity on a line of the measurement line 4 shown in FIG. 36. FIGS. 32, 34, and 36 are front views of an xz plane. In FIGS. 33, 35, and 37, a lateral axis shows a distance (mm) from an origin of the measurement line, and a vertical axis shows magnetic flux density (the unit is mG). As can be understood from FIGS. 33, 35, and 37, the magnetic-flux shielding effect increases in the order of setting of a mutual interval 3 mm, 6 mm, 15 mm, and 30 mm. When the mutual intervals are 30 mm and 40 mm, there is little difference in the magnetic shielding effect between these cases. From the above, under the condition of the Example 4, when a mutual interval between the cylindrical bodies is about 30 mm, a maximum magnetic-flux shielding effect can be obtained with a minimum mutual interval. At a point of (a position 0) on a magnet central axis, when the magnetic-flux shielding effect of a non-cylindrical body model is 1, the magnetic-flux shielding effect of the non-division model increases to 1.7, and the magnetic-flux shielding effect of the 30 mm-pitch three-division model increases to 2.45.

[III] Modifications of Embodiments

While respective embodiments of the present invention have been explained above, specific configurations and means of the present invention can be arbitrarily modified or improved within the technical scope of the respective inventions described in the claims. Such modifications are explained below.

(Regarding Problem to be Solved by the Invention and Effect of the Invention)

The problem to be solved by the invention and the effect of the invention are not limited to those described above, and the present invention can also solve problems not mentioned above or achieve effects not mentioned above. Further, in the present invention, only a part of the problem described above may be solved and only a part of the effect described above may be achieved.

(Regarding Shapes and Numerical Values)

The shapes and numerical values mentioned in the above embodiments are only exemplary, and the values of respective dimensions in the Examples can be arbitrarily changed.

According to the above mentioned embodiments, by increasing a magnetic resistance along axial directions of plural cylindrical bodies, lines of magnetic fields having principal directions along these axial directions can be promoted to bypass to adjacent directions of the plural cylindrical body units, and leakage of a magnetic field to an axial direction can be reduced or prevented.

According to the above mentioned embodiments, magnetic flux propagation can be promoted between plural cylindrical body units adjacent to each other, and induction of a magnetic flux along the axial directions of the cylindrical body units can be reduced. Therefore, discharging of a magnetic flux from an end surface of each of the cylindrical body units in the axial direction to outside can be reduced or prevented.

According to the above mentioned embodiments, by dividing each of the cylindrical body units into three or more parts, the number of interlayers present between the cylindrical body units can be increased, and magnetic resistances of plural cylindrical bodies along axial directions can be further increased. Therefore, leakage of a magnetic field to the axial direction can be further reduced or prevented.

According to the above mentioned embodiments, a magnetic shield room is configured by using the magnetic shield body according to any one of claims 1 to 3. With this arrangement, a magnetic shield room generating little leakage of a magnetic flux to outside can be constructed.

According to the above mentioned embodiments, leakage of a magnetic field from the magnetic shield room to outside can be further reduced by arranging in combination the first magnetic shield body and the second magnetic shield body at an optimum position corresponding to a principal direction of a line of magnetic force.

INDUSTRIAL APPLICABILITY

The present invention is to shield a magnetic field generated in a magnetic field generation source and is suitable for an open magnetic shield body configured by using cylindrical bodies and a magnetic shield room.

The invention claimed is:

1. A magnetic shield body configured to be arranged on at least a part of a wall that partitions a magnetic field generation source from outside such that magnetism generated by the magnetic field generation source can be at least partially shielded not to leak to the outside beyond the wall, comprising:
   a plurality of cylindrical body unit; and
   a supporting unit configured to support the plurality of the cylindrical body units, wherein
   each of the cylindrical body unit includes a plurality of cylindrical bodies having permeability,
   a cross-sectional shape of a cross section orthogonal to axial direction of each of the cylindrical bodies of each of the plurality of the cylindrical body unit is the same each other,
   the cylindrical bodies of each of the plurality of the cylindrical body unit are arranged such that central axes of the cylindrical bodies coincide with each other and side surfaces of the cylindrical bodies form a mutually same plane,
   the cylindrical bodies of each of the plurality of the cylindrical body unit are arranged with a mutual interval between the cylindrical bodies such that a magnetic resistance between the cylindrical bodies can be increased, and
   the supporting unit supports the plurality of the cylindrical body units such that side surfaces of the cylindrical bodies of the cylindrical body units face each other with a mutual interval.

2. The magnetic shield body according to claim 1, wherein a mutual interval between the cylindrical bodies constituting the cylindrical body unit and a mutual interval between the cylindrical bodies constituting another one of the cylindrical body unit adjacently arranged in the cylindrical body unit are arranged at positions adjacent to each other.

3. The magnetic shield body according to claim 1, wherein the cylindrical body unit is configured by having three or more of the cylindrical bodies arranged with a mutual interval between the cylindrical bodies.

4. A magnetic shield room having the magnetic shield body according to claim 1 arranged on at least a part of a wall that partitions a magnetic field generation source from outside.

5. A magnetic shield room, comprising
a first magnetic shield body and a second magnetic shield body that are configured to be arranged on at least a part of a wall that partitions a magnetic field generation source from outside such that magnetism generated by the magnetic field generation source can be at least partially shielded not to leak to the outside beyond the wall, wherein
the first magnetic shield body includes a plurality of cylindrical body unit, and a supporting unit configured to support the plurality of the cylindrical body units,
each of the cylindrical body unit has a plurality of cylindrical bodies having permeability,
a cross-sectional shape of a cross section orthogonal to axial direction of each of the cylindrical bodies of each of the plurality of the cylindrical body unit is the same each other,
the cylindrical bodies of each of the plurality of the cylindrical body unit are arranged such that central axes of the cylindrical bodies coincide with each other and side surfaces of the cylindrical bodies form a mutually same plane,
the cylindrical bodies of each of the plurality of the cylindrical body unit are arranged with a mutual interval between the cylindrical bodies such that a magnetic resistance between the cylindrical bodies can be increased,
the second magnetic shield body includes a cylindrical body unit configured by one cylindrical body having permeability, and a supporting unit that supports a plurality of the cylindrical body units such that side surfaces of the cylindrical body units face each other with a mutual interval between the side surfaces,
the first magnetic shield body is arranged such that the central axis of the cylindrical body unit of the first magnetic shield body is orthogonal to a wall surface direction, at a portion as a part of the wall where a principal direction of a line of magnetic force generated in the magnetic field generation source is orthogonal to the wall surface direction of the wall, and
the second magnetic shield body is arranged such that the wall surface direction is orthogonal to a central axis of a cylindrical body unit of the second magnetic shield body, at least at a part of a portion as other part of the wall where a principal direction of a line of magnetic force generated from the magnetic field generation source is not orthogonal to the wall surface direction of the wall.

* * * * *